(12) United States Patent
Wang et al.

(10) Patent No.: US 6,713,195 B2
(45) Date of Patent: Mar. 30, 2004

(54) MAGNETIC DEVICES USING NANOCOMPOSITE MATERIALS

(75) Inventors: Dexin Wang, Eden Prairie, MN (US); Zhenghong Qian, Eden Prairie, MN (US); James M. Daughton, Eden Prairie, MN (US); Robert T. Fayfield, St. Louis Park, MN (US)

(73) Assignee: NVE Corporation, Eden Prairie, MN (US)

( * ) Notice: Subject to any disclaimer, the term of this patent is extended or adjusted under 35 U.S.C. 154(b) by 5 days.

(21) Appl. No.: 10/041,910

(22) Filed: Jan. 7, 2002

(65) Prior Publication Data

US 2002/0146580 A1 Oct. 10, 2002

Related U.S. Application Data

(60) Provisional application No. 60/259,841, filed on Jan. 5, 2001.

(51) Int. Cl.$^7$ .............................. G11B 5/66; G11B 5/33
(52) U.S. Cl. ..................... 428/692; 428/332; 428/333; 428/668; 428/678; 428/469; 428/698
(58) Field of Search ................ 428/692, 668, 428/678, 469, 698, 332, 333

(56) References Cited

U.S. PATENT DOCUMENTS

| 5,940,253 A | * | 8/1999 | Mallary et al. ............. 360/126 |
| 6,090,480 A | | 7/2000 | Hayashi ...................... 428/332 |
| 2001/0041273 A1 | * | 11/2001 | Uwazumi et al. ...... 428/694 TS |

FOREIGN PATENT DOCUMENTS

| JP | 02-282916 | * | 11/1990 | ............ G11B/5/66 |
| JP | 03-222112 | * | 10/1991 | ............ G11B/5/66 |

OTHER PUBLICATIONS

Sato, T.; Miura, Y.; Matsumura, S.; Yamasawa, K.; Morita, S.; Sasaki, Y.; Hatanai, T. and Makino, A. New applications of nanocrystalline Fe(Co–Fe)–Hf–O magnetic films to micromagnetic devices. *Journal of Applied Physics*; v. 83, n. 11; Jun. 1, 1998; pp. 6658–6660.

Sato, T.; Komai, E.; Yamasawa, K.; Hatanai, T. and Makino, A. Application of nanocrystalline Fe(or Co–Fe)–Hf–O magnetic films with high electrical resistivity to micro DC–DC converters. *IEEE Transactions on Magnetics*; v. 33, n. 5; Sep. 1997; pp. 3310–3312.

Bloemen, P.J.H. and Rulkens, B. On the frequency dependence of the magnetic permeability of FeHfO thin films. *Journal of Applied Physics*; v. 84, n. 12; Dec. 15, 1998; pp. 6778–6781.

Song, J.Y.; Lee, J.J.; Han, S.H.; Kim, H.J. and Kim, J. Soft magnetic properties of as-deposited Fe–Hf–C–N and Fe–Hf–N nanocrystalline thin films. *Journal of Applied Physics*; v.83, n. 11; Jun. 1, 1998; pp. 6652–6654.

Choi, J.O., Lee, J.J.; Han, S.H.; Kim, H.J. and Kang, I.K. Soft magnetic properties of nanocrystalline Fe–Hf–C–N films. *Journal of Applied Physics*; v. 75, n. 10; May 15, 1994; pp. 5785 and 5787.

(List continued on next page.)

Primary Examiner—Deborah Jones
Assistant Examiner—Vivek Koppikar
(74) Attorney, Agent, or Firm—Kinney & Lange, P.A.

(57) ABSTRACT

A ferromagnetic thin-film based magnetoresistive device with a first ferromagnetic material based film having electrically conductive, ferromagnetic material nanogranules embedded in an intergranular material of a smaller electrical conductivity first nonmagnetic. The device may have an intermediate layer adjacent the first ferromagnetic material based film and a second film is on the other side of the intermediate layer of a substantially ferromagnetic material. The first film is less than 1.0 $\mu$m thick.

52 Claims, 18 Drawing Sheets

OTHER PUBLICATIONS

Chen, L.H.; Zhu, W.; Tiefel, T.H.; Jin, S.; van Dover, R.B. and Korenivski, V. Fe–Cr–Hf–N and Fe–Cr–Ta–N soft magnetic thin films. *IEEE Transactions on Magnetics*; v. 33, n. 5; Sep. 1997; pp. 3811–3813.

Russek, S.E., Kabos, P.; Silva, T.; Mancoff, F.B.; Wang, D.; Qian, Z. and Daughton J.M. High frequency measurements of CoFeHfO thin films. *IEEE Transactions on Magnetics*; v. 37, n. 4; Jul. 2001; pp. 2248–2250.

Lo, C.C.H.; Snyder, J.E.; Leib, J.; Wang, D.; Qian, Z.; Daughton, J.M. and Jiles, D.C. Magnetization reversal in CoFeHfO films. *IEEE Transactions on Magnetics*, v. 37, n. 4; Jul. 2001; pp. 2337–2339.

Wang, D.; Qian, Z.; Daughton, J.M., Nordman, C.; Tondra, M.; Reed, D. and Brownell, D. Fabrication and properties of spin dependent tunneling junctions with CoFeHfO as free layers. *Journal of Applied Physics*; v. 83, n. 11; Jun. 1, 1998; pp. 6754–6756.

\* cited by examiner

MAGNETIC DEVICES USING NANOCOMPOSITE MATERIALS

CROSS-REFERENCE TO RELATED APPLICATION(S)

This application claims the benefit of Provisional Application No. 60/259,841 filed on Jan. 5, 2001, entitled "Magnetic Devices Using Nanocomposite Materials".

This invention was made in part with government support under Contract #DMI-9961165 awarded by NSF. The government has certain rights in this invention.

BACKGROUND OF THE INVENTION

The present invention relates to ferromagnetic thin-film structures exhibiting relatively large magnetoresistive characteristics and, more particularly, to such structures used for the storage and retrieval of digital data and for the sensing of externally generated magnetic fields.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Magnetometers and other magnetic sensing devices are also used extensively in many kinds of systems including magnetic disk memories and magnetic tape storage systems of various kinds, magnetic signal couplers, magnetic field determiners, and the like. Such devices provide output signals representing the magnetic fields sensed thereby in a variety of situations.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

As indicated above, the giant magnetoresistive effect can be increased by adding further alternate intermediate nonmagnetic and ferromagnetic thin-film layers to extend a "sandwich" structure into a stacked structure, i.e. a superlattice structure. The giant magnetoresistive effect is sometimes called the "spin valve effect" in view of the explanation that a larger fraction of conduction electrons are allowed to move more freely from one ferromagnetic thin-film layer to another if the magnetizations in those layers are parallel than if they are antiparallel or partially antiparallel to thereby result in the magnetization states of the layers acting as sort of a "valve."

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

A memory cell structure suitable for permitting the storing and retaining of a digital bit of information, and for permitting retrieving same therefrom, has been demonstrated based on a multiple layer "sandwich" construction in a rectangular solid. This cell has a pair of ferromagnetic layers of equal thickness and area separated by a conductive nonmagnetic layer of the same shape and area parallel to the ferromagnetic layers but of smaller thickness. These ferromagnetic layers are each a composite layer formed of two strata each of a different magnetic material, there being a relatively thin ferromagnetic stratum in each of the composite layers adjacent the nonmagnetic layer and a thicker ferromagnetic stratum in each of the composite layers adjacent the thin ferromagnetic stratum therein. The ferromagnetic material of the thick stratum in one of the composite layers is the same as that in the thin stratum in the other composite layer, and the ferromagnetic material of the thin stratum in the first composite layer is the same as the ferromagnetic material in the thick stratum of the second composite layer. Each of the composite layers is fabricated in the presence of a magnetic field so as to result in having an easy axis parallel to the long sides of the rectangular solid, or alternatively parallel to the short sides of the rectangular solid depending on desired magnetic and electrical resistance characteristics.

Thus, this memory cell structure has a pair of ferromagnetic layers of matching geometries but different magnetic materials in the strata therein to result in one such layer having effectively a greater saturation magnetization and a greater anisotropy field than the other to result in different coercivities in each. In addition, the structure results in a coupling of the magnetization between the two ferromagnetic layers therein due to exchange coupling between them leading to the magnetizations in each paralleling one another in the absence of any applied magnetic fields. As a result, the electrical resistance of the cell along its length versus applied magnetic fields in either direction parallel thereto is represented by two characteristics depending on the magnetization history of the cell. Each of these characteristics exhibits a peak in this resistance for applied longitudinal fields having absolute values that are somewhat greater than zero, one of these characteristics exhibiting its peak for positive applied longitudinal fields and the other characteristic exhibiting its peak for negative applied longitudinal fields. The characteristic followed by the resistance of the cell for relatively small applied longitudinal fields depends on which direction the magnetization is oriented along the easy axis for the one of the two ferromagnetic layers having the larger coercivity. Thus, by setting the magnetization of the layer with the higher coercivity, a bit of digital information can be stored and retained, and the value of that bit can be retrieved without affecting this retention through a determination of which characteristic the resistance follows for a relatively small applied longitudinal field.

Such memory cell behavior for this structure can be modeled by assuming that the ferromagnetic layers therein are each a single magnetic domain so that positioning of the magnetization vectors in the ferromagnetic layers is based on coherent rotation, and that uniaxial anisotropies characterize those layers. The angles of the magnetization vectors in the two ferromagnetic layers with respect to the easy axis in those layers are then found by minimizing the magnetic energy of these anisotropies summed with that due to the applied external fields and to exchange coupling. That total energy per unit volume is then:

$$E_{Tot}=E_1+E_2+E_{12}=K_{u1} \sin^2 \theta_1 - M_{s1}H \cos(\Psi-\theta_1)+K_{u2} \sin^2 \theta_2 - M_{s2}H \cos(\Psi-\theta_2)+A_{12} \cos(\theta_1-\theta_2).$$

Here, $K_{u1}$ and $K_{u2}$ are anisotropy constants, $A_{12}$ is the exchange constant, $M_{s1}$ and $M_{s2}$ are the magnetization saturation values, and H is the externally applied field. As indicated above, once the magnetization vectors have taken an angular position with respect to the easy axis of the corresponding layer at a minimum in the above indicated energy, the effective resistance between the ends of the memory cell structure is determined by the net angle between the magnetization vectors in each of these layers.

Because of the assumption of single domain behavior in the ferromagnetic layers, the above equation would seemingly be expected to improve its approximation of the assistant total magnetic energy as the length and width of that memory cell structure decreased toward having submicron dimensions. However, this mode of operation described for providing the two magnetoresistive characteristics based on the history of the layer magnetizations, in depending on the differing anisotropy fields in the two ferromagnetic layers because of the differing materials used therein, becomes less and less reliable as these dimensions decrease. This appears to occur because decreasing the cell dimensions gives rise to larger and larger demagnetizing fields in the two ferromagnetic layers which, at some point, overwhelm the effects of the anisotropy fields so that the above described behavior no longer occurs as described. In addition, the magnetizations of the two ferromagnetic layers rotate together under the influences of externally applied fields at angles with respect to the corresponding easy axis at angular magnitudes much more nearly equal to one another because of the increasing demagnetization fields in these layers as the dimensions thereof decrease. As a result, these ferromagnetic layers are less and less able to have the magnetizations thereof switch directions of orientation independently of one another as the dimensions thereof decrease so that the structure they are in becomes less able to provide the above described memory function in relying on only these ferromagnetic layer anisotropy differences.

An alternative memory cell structure which is more suited to submicron dimensions is a cell of the kind described above exhibiting "giant magnetoresistive effect" but which has the two composite ferromagnetic layers formed of different thicknesses in the thick strata therein. Thus, the thick strata in one might be on the order of 40 Å while that of the other might be on the order of 55 Å as an example. In this structure, reducing the size to submicron dimensions uses the shape anisotropy introduced by this thickness difference to provide different switching thresholds for each of the ferromagnetic composite layers in response to externally applied operating magnetic fields. The shape anisotropy leads to the effect of the demagnetizing field of one layer affecting the switching threshold of the other after the former layer has switched its magnetization direction. As a result, the thicker ferromagnetic layer has a magnetization which is fixed in orientation for externally applied operating magnetic fields that are just sufficient to switch the thinner ferromagnetic composite layer but not great enough to switch the magnetization of the thicker ferromagnetic composite layer. In effect, the demagnetizing fields as the device becomes sufficiently small dominate the anisotropy fields that result from the deposition of the ferromagnetic layers in the presence of a magnetic field. Alternatively, one of the ferromagnetic layers could have the magnetization thereof "pinned" in orientation by an antiferromagnetic layer provided thereon rather than by thickening that ferromagnetic layer relative to the other.

In the absence of externally applied operating magnetic field, the two composite ferromagnetic layers have the magnetizations therein pointing in opposite directions, i.e. they are antiparallel to one another, to result in the structure as a whole having relatively small cell demagnetizing fields and small external stray fields to affect the nearby memory cells. The direction of magnetization in the thicker ferromagnetic composite layer is used to store the digital information which can only be changed in direction by externally applied fields great enough to switch magnetization directions in both composite ferromagnetic layers. That is, storing new information in the cell requires that the thicker ferromagnetic layer be capable of having the magnetization direction therein switched to be in accord with the incoming digital data.

Retrieving information from such a memory cell is accomplished by switching the magnetization direction of the thinner ferromagnetic composite layer only as a basis for determining in which direction relative to the thinner layer is the magnetization oriented in the thicker layer. Typically, both such storing and retrieving has meant that there needs to be a pair of external conductors which can coincidentally supply current to result in a field large enough to switch the magnetization of the thicker ferromagnetic composite layer, but with that current in either conductor alone being able to generate fields only sufficient to switch the threshold of the thinner ferromagnetic layer. In some situations, only a single external conductor need be provided for this purpose because the sense current used in retrieving information from the memory cell can provide the coincident current needed with the current in the external conductor to switch the magnetization direction of the thicker ferromagnetic layer.

An alternative digital data bit storage and retrieval memory cell suited for fabrication with submicron dimensions can be fabricated that provides rapid retrievals of bit data stored therein and low power dissipation by substituting an electrical insulator for a conductor in the nonmagnetic layer. This memory cell can be fabricated using ferromagnetic thin-film materials of similar or different kinds in each of the magnetic memory films used in a "sandwich" structure on either side of an intermediate nonmagnetic layer which ferromagnetic films may be composite films, but this intermediate nonmagnetic layer conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers which are set by their magnetization directions to provide a "magnetic valve effect". Such an effect results in an effective resistance or conductance characterizing this intermediate layer with respect to the "tunneling" current therethrough. In addition, shape anisotropy is used in such a cell to provide different magnetization switching thresholds in the two ferromagnetic layers by forming one of the ferromagnetic layers to be thicker than the other. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

As stated above, operating magnetic fields imposed externally can be used to vary the angle of the magnetization vector with respect to the easy axis in the ferromagnetic films of these various kinds of memory cell devices. Such operational magnetic fields imposed externally can be used to vary the angle to such an extent as to cause switching of the film magnetization vector between two stable states which occur for the magnetization being oriented in opposite directions along the film's easy axis, the state of the cell determining the value of the binary bit being stored therein.

Alternatively, the plurality of cells can be interconnected with manipulation circuitry having a plurality of transistors so that each cell has a selection transistor electrically coupled thereto that selectively substantially permits and prevents current in at least one direction along a current path through that cell. Thus, in effect, the cell is switching circuit selected rather than coincident currents-magnetic fields selected for data storing and retrieving operations.

Similarly, a magnetic field sensor suited for fabrication with dimensions of a few microns or less can be fabricated that provides a suitable response to the presence of external magnetic fields and low power dissipation by substituting an electrical insulator for a conductor in the nonmagnetic layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer again conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough.

In these memory cell types, and in magnetic sensors that are to sense rapidly varying magnetic fields such as in magnetic disk memories and magnetic tape storage systems ("read head sensor"), a large memory cell device state switching rate or a large sensor material magnetization response rate to external magnetic field changes is desired to allow rapid data manipulation. The maximum operating rate of many magnetically based circuit devices is improved by the use of materials exhibiting magnetic characteristics that include, to some degree, relatively large magnetic saturations, relatively large anisotropy fields, relatively large electrical resistivity, and relatively small hysteresis, or all of these as will be shown below. Should the surface properties of materials exhibiting such properties be amenable to integration with thin-film based magnetoresistive circuit elements, such materials can be used to improve the maximum operating rate of spin dependent tunneling (SDT) devices, giant magnetoresistive (GMR) devices, and anisotropic magnetoresistive (AMR) devices.

SDT devices are very attractive in many applications and the technology and the technology for their design and manufacture is the most likely magnetoresistive circuit device technology to be next commercialized after the technology for the design and manufacture of GMR devices which is now being used to provide such devices in read heads for hard disk drives and in magnetic field sensor products. SDT devices have two main advantages over the state of art GMR devices that have so far been commercialized. One advantage is a factor of 4 to 6 in higher magnetic field-sensitivity, and the other is the orders of magnitude of greater electrical resistance that is easily attainable in devices of small sizes. A typical SDT junction has a magnetoresistive (MR) ratio between magnetic states of 30% to 50% and a saturation magnetic field of about 20 to 30 Oe, leading to a raw field sensitivity of about 1 to 2%/Oe, and a wide range of resistance-area products (RAP) of $10^2$ to $10^{10}$ $\Omega\text{-}\mu m^2$. With on-chip current biasing, a magnetic field sensitivity as high as 7%/Oe has been achieved. The thermal stability has been found to be adequate for integration with integrated circuit electronics in a monolithic integrated circuit chip and for high temperature operations. These superior properties make SDT devices especially attractive for low-field/low-power system applications. They are also attractive for rapid operation applications assuming low RAP SDT junctions can be made reliably. A low junction RAP is necessary as it indicates relatively small parasitic and intrinsic junction capacitance and resistance which would otherwise lead to RC time constant circuit operation delay problems.

Additional examples of rapid operation magnetic thin-film circuit device applications in addition to the hard drive read heads indicated above include galvanic isolators and magnetic memory. The operating rate of these devices is a key performance parameter if manipulations of data are to be performed with sufficient rapidty to accomplish system performance goals in many of these systems. Such devices typically use the magnetoresistance effect, whereby the orientation of the magnetization of a layer or layers within the thin film multilayer structure is determined by measuring the resistance of the structure after selected device operations.

Several types of magnetoresistive structures are commonly used including SDT device structures, GMR spin valve device structures, GMR multilayer device structures, and AMR device structures. In all cases, the resistance changes as the orientation of the magnetizations of one or more magnetic material layers therein rotates. When these magnetoresistive devices are used in an electrical circuit, the electrical signal changes as the magnetization rotates. Thus, the rate of rotation of the magnetization of the magnetic layer or layers involved is directly related to circuit performance. That is, to the extent that the measured resistance of such a device exactly follows the rotation of the magnetization of the involved magnetic material layers therein, the magneto-dynamics of those device layers determine the rate of operation of the device. However, limitations exist in the structure and design of existing magnetic thin-film based magnetoresistive circuit devices insofar as the rate (device operations per second) at which the devices can operate. These limitations are rooted in both the physical material and the mode of magnetic operation that are typically used.

The dynamic response of the magnetization orientation in a magnetic material layer to an externally applied magnetic field is well known to be described satisfactorily by the Landau-Lifshitz-Gilbert (LLG) equation:

$$dM/dt = -\gamma M \times H + (\alpha/|M|) M \times (dM/dt)$$

where M is the magnetization, H is the total effective magnetic field, $\gamma$ the gyromagnetic ratio, $\alpha$ is the damping constant, and x represents the usual vector cross product.

Because the mathematical formulation is identical, it is useful to describe how the dynamic magnetic action is directly analogous to the precessing of the classical mechanics example of a single fixed point spinning top. Just as the spinning axis of the top (axis of angular momentum) precesses about the axis of an external mechanical torque, so does the magnetic moment (axis of angular momentum) of an atom or molecule precess about the axis of an external magnetic torque. The rate of this precession is directly proportional to the torque.

Modified spherical coordinates will be used for the following discussion. In this coordinate system, the $\phi=0°$ plane corresponds to the Cartesian X-Y plane, and $\phi=+90°$ and $-90°$ correspond to the Cartesian +Z and -Z axes, respectively. In the $\phi=0°$ plane, $\theta=0°$, $+90°$, and $+180°$, corresponds to the -X, +Y, and +X axes of the Cartesian system. Because of demagnetizing fields in ferromagnetic thin films, the magnetization lies in the plane of the film ($\phi=0°$) in steady state situations. Due to device structural considerations, the field components that can be generated in the vicinity of a thin-film device are also primarily in the $\phi=0°$ plane. Consequently the magnetodynamic response of interest in a ferromagnetic thin-film material based magnetoresistive circuit device to an in-plane externally applied magnetic field is a rotation from one orientation to another, where both orientations are in the $\phi=0°$ plane. That the starting and ending orientations are in the $\phi=0°$ plane does not require that the magnetization be in the plane during the non-equilibrium "switching" times. The actual dynamic response involves small but important rotations out of the plane.

Suppose the magnetization of a thin ferromagnetic film is initially oriented to be at θ=0° and φ=0°. At time =0 picoseconds (ps), an in-plane field, $H_{applied}$, is provided. A torque is generated by this field with the magnitude $H_{applied} \times M$ (this is in the first term in the LLG equation above). If $H_{applied}$ has some component in the θ=+90° direction, the initial response of the magnetization to the applied torque is a rotation out of the plane (φ>0). This initial response quickly generates an out-of-plane demagnetizing field in the −φ direction as free poles accumulate on the top and bottom surface of the film. This out-of-plane demagnetizing field then generates a torque that causes the magnetization to rotate in the plane in the positive θ direction.

Assume, for example, $H_{applied}$ remains steadily for 1000 ps. Once θ=90° (at about 100 ps) the torque due to it is 0. For the half-plane 90°<θ<270°, the torque due to $H_{applied}$ is in the direction opposite it is for the other half-plane. Thus, the magnetization responds by rotating towards the negative φ direction, generating an out-of-plane demagnetizing field along φ=+90°, which creates a torque in the −θ direction. The in-plane rotation of θ is reversed by about t=200 ps. The magnetization will oscillate between θ=0° and 180° if $H_{applied}$ is left on indefinitely. Following up with the above mechanical top analogy, the torque is provided in the mechanical top analogue by gravity or other mechanical forces or both. In the magnetic moment analogue, the torque is provided by magnetic fields. The plane of the thin film is the same as the "floor" for the top analogue. Where gravity causes the top axis to precess about the vertical direction, the force from vertical demagnetizing fields causes the magnetization to precess in the thin-film plane. An externally applied in-plane force on the top would initially cause nutation, not precession. Likewise, the force from an externally applied in-plane magnetic field generates out-of-plane action, not precession.

In most ferromagnetic thin-film based magnetoresistive circuit devices, some magnetic anisotropy is normally present in the thin film. Magnetic anisotropy means that it is energetically favorable for the magnetization to lie in certain directions. A common arrangement is for the "easy" axis (the energetically favorable axis) to lie along θ=0° and 180° and the "hard" axis (energetically unfavorable) lies along θ=90° and 270°. The size of the anisotropy is often measured in terms of the applied field required to overcome it. For instance, if 75 Oe (steady state) is required to saturate the magnetization (cause it to have its maximum magnitude) at θ=+90° rather than 0°, then the magnetic anisotropy is 75 Oe. The results of such a measurement are shown in FIG. 1. The saturation magnetization, $M_{sat}$, and the anisotropy field, $H_k$, are defined in terms of the response of the magnetization to a field applied along the easy and hard directions of the material. The hard axis data is the linear and non-hysteretic loop. On this plot, the saturation magnetization is the maximum value of magnetization. The anisotropy field, $H_k$, is the field at which the magnetization first saturates. Thus, one can see that $M_{sat}$ is about 1000 emu/cc, and $H_k$ is about 75 Oe.

This typical kind of anisotropy results in there being two most favorable (stable) states for the magnetization at θ=0° and 180°, and φ=0°. These two magnetization states directly correspond to the two magnetic states of a digital circuit device such as a magnetoresistive memory (MRAM) cell or a digital mode magnetoresistive isolator. The operating rate of these devices is directly related to the time required to cause the magnetization to rotate from one state to the other in a stable fashion.

Setting aside device operation for a bit, consider the previously discussed ferromagnetic thin film with an effective anisotropy of 75 Oe. This anisotropy field adds to any applied field and acts as a "restoring force" to the magnetization when it is not at θ=0° or 180°. If instead of leaving $H_{applied}$ on in its original orientation (θ=+90°), it is reversed at the optimal times (this turns out to be when the magnetization is at θ=90° and again at 270°) the magnetization will precess through an arbitrary number of oscillations. Mathematically, it can be shown that this is a "resonance" condition, where the driving frequency and internal restoring forces are ideally matched for maximum response.

Assume there is a sinusoidal in-plane driving field at frequency f. Using the LLG equation, when the damping term (second term on the right side, with damping coefficient alpha) is much smaller than the precession term (first term on the right side), the imaginary part of the permeability (4πdM/dH) of the magnetic material is:

$$\mu''(f) \propto 1/[1-(f/f_{FMR})]^2$$

where f is the excitation frequency and $f_{FMR}$ the ferromagnetic resonance frequency, or $$f_{FMR} = \gamma [4\pi M_s \cdot H_k]^{1/2}$$

where $M_s$ is the saturation magnetization and $H_k$ is the effective anisotropy field. It is clear that when excitation frequency f approaches $f_{FMR}$, $\mu''(f)$ approaches infinity. This is the mathematical way of describing the resonance phenomena. Generally, a higher $f_{FMR}$ leads to higher device operating rates.

The damping factor, α, in the LLG equation is an empirically measured term that takes into account all means of energy transfer from magnetic rotation to other forms. Several physical phenomena play a role in damping. Structural excitations such as phonons and magnons contribute to a larger and lesser degree, respectively. Thermal heating due to eddy currents and interactions with atomic nuclei also contribute.

Eddy currents are also a problem due to their screening of $H_{applied}$. Induced eddy currents act to generate a field in the opposite direction of that being applied. These induced fields can partially or completely cancel out the applied field. The eddy current screening effect can be characterized by a parameter called the "skin depth":

$$\lambda = \{\rho/[\pi f \mu]\}^{1/2}$$

where ρ is the material electrical resistivity, f is the frequency of the applied field, and μ is the permeability:

$$\mu = [4\pi M_s/H_k] \text{ (hard axis)}.$$

The skin depth, λ, is the depth at which the net field (applied minus eddy current field) is 1/e times that at the surface. The effects of eddy current screening at a given frequency of device operation can best be minimized by increasing ρ.

Many present-day magnetoresistive devices are switched in a quasi-static mode. That is, an in-plane magnetic field is applied parallel to the direction of desired resulting magnetization. After enough time, the magnetization will be oriented along this direction since it has the lowest magnetostatic energy. However, the "path" that the magnetization takes during this reorientation is quite complicated, as it probably takes in several cycles of precessional rotation, and/or domain wall motion. If possible, magnetic switching should not involve magnetic domain wall motion, but rather precession that is uniform across the device. Domain walls may exist prior to the attempt at switching, or they may be nucleated at energetically favorable locations in the initial stage of switching. Once initiated, domain wall propagation occurs through the film until equilibrium is reached. At all points, the local magnetic rotation that makes up the domain wall action is described by the same LLG equation that applies to uniform precession. Consequently, domain wall motion can never be faster than uniform precession, and is usually much slower.

Generally when operating in the dynamic switching regime, a material with a higher $f_{FMR}$ will take less time and energy to switch. Consider again the two-state magnetic thin-film based magnetoresistive circuit device. In order to switch the magnetization from θ=0° to 180° at or near the $f_{FMR}$, special applied field timing is desirable. An in-plane applied field perpendicular to the magnetization (θ=+90°) is needed to initiate the out-of-plane precession, and the resulting vertical demagnetizing field-induced in-plane rotation. As noted above, however, the in-plane applied field must not be left on indefinitely or a continual oscillation between θ=0° and 180° will result. The anisotropy energy and damping coefficient play important roles in this switching action. In an overdamped case, the applied field must be left on until θ>90°, at which point the anisotropy field will cause the magnetization to stabilize at θ=180°. In the underdamped case, the applied field must be left on until θ approaches 180°. Here the same field that induces acceleration when the magnetization is at 0 degrees also induces deceleration when the magnetization approaches θ=180° degrees. It may also be possible to divide the applied field pulse into two parts at the beginning and end, saving some energy. In this case, the first pulse initiates rotation while the second pulse halts it. At increasingly higher frequencies, increasingly larger fields must be applied to induce the magnetization to precess in the allotted time.

A high saturation magnetization and a high magnetic anisotropy field for a magnetic material makes its FMR frequency high, a high material resistivity makes its skin depth large, and reversals of its magnetization direction through primarily rotation makes that magnetization respond fast to a rapidly changing applied magnetic field.

In order to be considered a good soft magnetic material, μ needs to be high, regardless of the speed. Also, λ decreases with f and is the thickness limit (for any given f) for the magnetic material, beyond which any additional material becomes magnetically inactive. Therefore, the greater the value of λ the better. We see right away that there is a conflicting requirement for $H_k$ in the magnetic material. A high $H_k$ is needed for a high $f_{FMR}$, but a low $H_k$ is needed for a high permeability μ. Therefore, a compromise has to be reached, depending on the specific application for the magnetic material. For very high frequency applications, such as RF devices, a bias field is normally needed to achieve a high $f_{FMR}$. However, if the induced anisotropy field can be enhanced in the material, there will be a reduced requirement for the biasing. On the other hand, there is always a desire for a magnetic material with a large saturation magnetization and a high resistivity, along with a low loss at the operating frequency.

BRIEF SUMMARY OF THE INVENTION

The present invention provides a ferromagnetic thin-film based magnetoresistive device having a substrate with a major surface on which a first ferromagnetic material based film is supported having electrically conductive, ferromagnetic material nanogranules embedded in an intergranular material of a smaller electrical conductivity first nonmagnetic. The device may have an intermediate layer adjacent the first ferromagnetic material based film and a second film is on the other side of the intermediate layer of a substantially ferromagnetic material. The material in the nanogranules is one of Fe, Co, Cr or alloys thereof, the intergranular material is one of HfO, TaN, HfCN, HfN, HfTa or CrO, the ferromagnetic material of said second film is one of Fe, Co, Ni or alloys thereof, and the intermediate layer is a nonmagnetic electrically conductive or electrically insulative material. The first film is less than 1.0 μm thick.

DETAILED DESCRIPTION

As described above, a ferromagnetic thin-film based magnetoresistive circuit device will have enhanced operating rates if several material characteristics exist for the "free" layer of the device. These are quickly summarized as high $f_{FMR}$, high resistivity, and high saturation magnetization. The present invention describes the use of a class of materials that have these high operation rate characteristics to a greater degree than commonly used materials as a ferromagnetic free layer within ferromagnetic thin-film based magnetoresistive circuit devices. The relevant class of materials can best be described as a ferromagnetic thin-film material having relatively higher conductivity ferromagnetic nanogranules embedded in a relatively lower conductivity intergranular matrix. The thin-film combination of nanogranules within an intergranular matrix will be referred to as a nanocomposite thin film. The nanocomposite thin film is an inhomogeneous mixture of phases, where a ferromagnetic material dominates the composition of the nanogranular phase and a nonmagnetic material dominates the composition of the intergranular phase. Nanogranules are specified by their physical dimensions. The maximum of the nanogranule size distribution is typically on the order of 10 nm or less. The high end of the size distribution could well extend beyond 100 nm, though such large nanogranules would be rare.

Figure 2A:
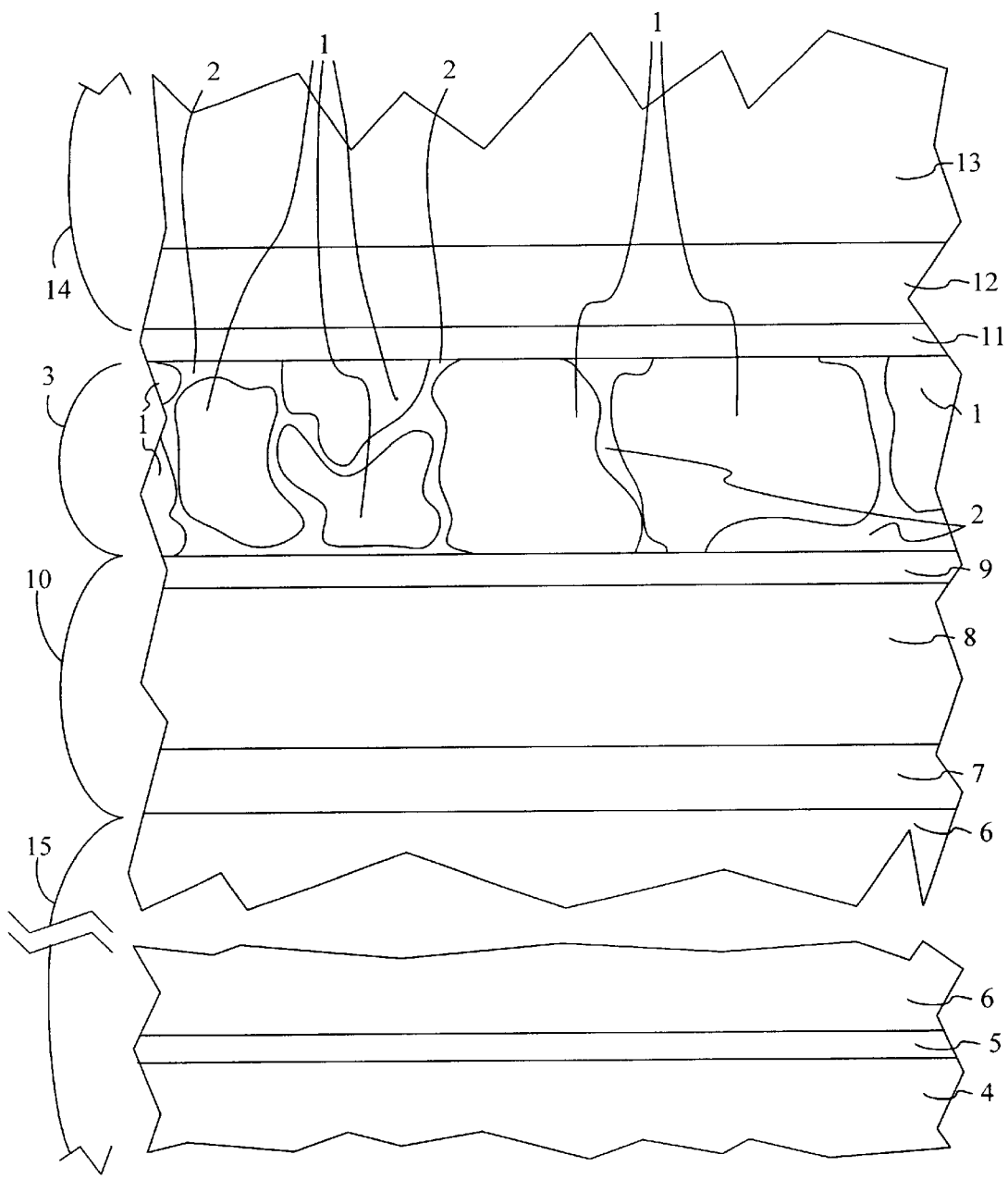
FIGS. 2A and 2B show a layer diagram and a top view of portions of a SDT device magnetoresistive material stack including a nanocomposite CoFe—HfO material layer.
Figure 2:
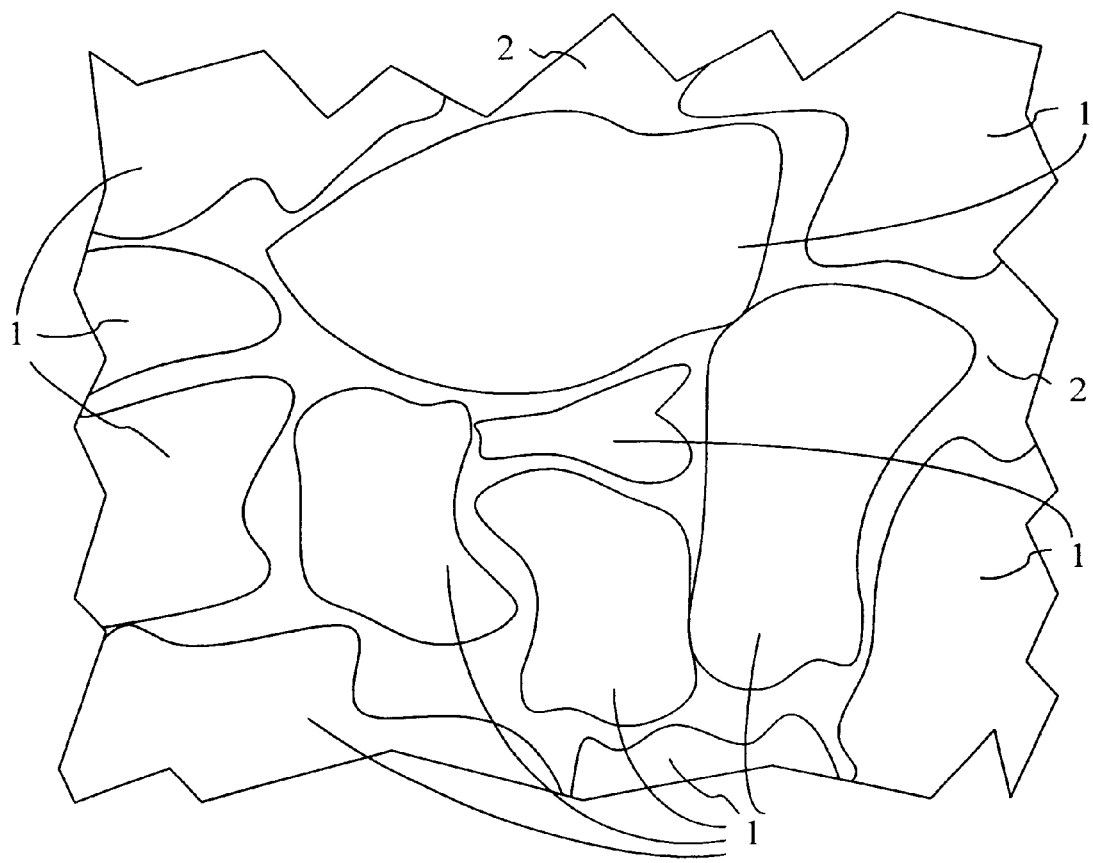

FIG. 2A is a layer diagram of a ferromagnetic nanocomposite layer as it is used in a typical SDT structure. Corresponding to FIG. 2A is a plan view 2B of only the nanocomposite layer. The ferromagnetic nanogranules 1, together with the intergranular matrix 2, form the ferromagnetic nanocomposite layer 3. Note that the nanogranules need not extend from top to bottom of the nanocomposite layer. The underlying base for the layers shown here is typically a semiconductor-based integrated circuit wafer 4, whose top surface is typcially passivated with about 500 nm of $SiO_2$. The semiconductor substrate 4 typically has monolithic circuit components integrated therein. Subsequently formed vias connect the ferromagnetic thin film devices in order to operate with and receive signals from them. A 50 nm TaN etch-stop layer 5 and 200 nm $Si_3N_4$ layer 6 are formed on the semiconductor wafer by sputter deposition. Together, layers 4, 5, and 6, form a generic insulating substrate 15 that supports and provides a suitable surface for the subsequent formation of the SDT structure. Upon surface 15, sputter deposition of a 4 nm Ta layer 7, a 10 nm Cu layer 8, and a 2 nm Ta layer 9, forms a multi-strata buffer layer 10 for the 10 nm thick ferromagnetic nanocomposite CoFe—HfO thin film layer 3. Layer 3 is also formed by RF sputter deposition from a CoFeHf target whose composition is Co 56, Fe 25, Hf 19 (all in atomic %). However, a trace concentration of oxygen is provided in addition to the usual 30 mTorr of Ar in the sputter gas during deposition. The amount of oxygen in the sputter gas controls, in part, the oxygen content of the resulting CoFe—HfO layer.

An $Al_2O_3$ tunnel barrier layer 11 is formed by sputter deposition of aluminum onto layer 3. After deposition, the aluminum is oxidized in a plasma of $Ar/O_2$. The amount of oxygen in the sputter gas controls, in part, the oxygen content of the resulting $Al_2O_3$. The unoxodized aluminum layer expands by approximately 30% when it is oxidized. Layer 11 ranges in thickness from 0.5 nm to 4 nm depending upon the desired resistance of the subsequently formed spin dependent tunnel junctions.

A composite ferromagnetic "hard" layer 14 is provided on top of tunnel barrier layer 11 through further sputter deposition. The first stratum, 12, of this hard layer is a 5 nm thickness of CoFe from a target of composition Co 95, Fe 5 (atomic %). The second stratum, 13, is a 30 nm thickness of antiferromagnetic CrPtMn whose composition is Cr 45, Pt 10, Mn 45 (atomic %). During the deposition of layers 3, 12, and 13, a magnetic field of 20 Oe is applied to induce the "easy" anisotropy axis. Post-deposition annealing of the finished SDT junction material stack is done in ambient atmosphere at a temperature of 250° C. for one hour in an applied magnetic field applied of 4000 Oe parallel to the easy axis. This anneal serves to enhance the "hardness" of the hard layer 14 by enhancing the exchange coupling between its strata 12 and 13. The anneal also improves the quality of the tunnel barrier layer 11.

Several ferromagnetic nanocomposite materials exhibit the resistive and magnetic properties desired for the "free" layer of a magnetoresistive thin film structure. CoFe—HfO (hereafter, a hyphenated nanocomposite material composition identifies the pre-hyphen species as the ferromagnetic nanogranular phase and the post-hyphen species as the intergranular phase) is one of the best. Others include Fe—HfO, Fe—CrTaN, Fe—HfCN, Fe—HfN, Co—HfTa, Co—CrO, Co—HfO, etc. This group of materials has great potential for rapid operation device applications when appropriately situated in ferromagnetic thin-film based magnetoresistive devices. The subsequent description will be based on only CoFe—HfO but will often apply to the rest of the foregoing nanocomposite materials.

The present disclosure shows that relatively thin (on the order of 10 nm) films of nanocomposite CoFe—HfO have excellent resistive and magnetic properties, and that such films are amenable to inclusion in magnetoresistive structures. Though ferromagnetic thin-film based magnetoresistive circuit devices typically have soft film thicknesses of about 10 nm, there are some uses for ferromagnetic nanocomposite materials in thicknesses up to 1,000 nm. This is especially true in the variants of the SDT structure, where only the interfaces of the ferromagnetic films with the tunnel barrier (and not the thickness) determine the nominal resistance of the device. A specific example of a use for a 1,000 nm layer is in a structure called a "spring magnet" where the non-tunnel barrier surface of the free layer is pinned by exchange coupling to a high-anisotropy material. This structure can have an excellent combination of "soft" and non-hysteretic magnetic characteristics.

CoFe—HfO has a high saturation magnetization combined with a high resistivity. The high saturation magnetization comes from the fact that the higher conductivity ferromagnetic nanogranular phase, 1, mimics the magnetic properties of the base CoFe alloy. Though some amount of Hf and O may reside in the nanogranular phase, it is desirable that the HfO be largely in the intergranular matrix, 2. This is because the nanogranules will not be ferromagnetic if they contain too many impurities. Non-ferromagnetic impurities act to reduce or eliminate the ferromagnetic behavior of a ferromagnetic host by interfering with the exchange coupling between neighboring ferromagnetic atoms. The HfO rich intergranular phase, however is desirable for its high resistivity. The ferromagnetic nanocomposite structure, then, is an ideal physical phase mixture of highly magnetic conductive material with resistive material.

The ferromagnetic nanocomposite structure 3 is especially compatible with the electrical operation and fabrication of magnetic tunnel junctions. The electrical conduction across a tunnel barrier (typically about 1.5 nm of $Al_2O_3$) is proportional to the density of conduction electrons on both sides of the tunnel barrier at a given point. The majority of tunneling current from a nanocomposite layer will be from the relatively higher conductivity regions. In the case of CoFe—HfO, the high conductivity regions are also the most magnetic regions. The quality of tunnel junctions depends strongly on the stoichiometry of the barrier material 11. If there is an excess or deficit of oxygen in the barrier, it can have poorer insulating properties, or even conductive "pinholes". It is known that annealing tunnel junction structures can improve their structure and properties. This improvement is thought to be related to the migration of oxygen to where it is needed. The affinity of unoxodized aluminum for oxygen is stronger than that of the ferromagnetic transition metals Ni, Fe, and Co, so when oxygen is freed up due to the addition of thermal energy, the Al barrier takes what it needs, and leaves the rest for the "free" and "hard" ferromagnetic layers adjacent to either surface of the barrier. In the structure using a ferromagnetic nanocomposite layer for the "free" layer, the lower conductivity intergranular matrix 2 likely acts as a sort of oxygen reservoir. As a result, the stoichiometry of the barrier 11 can be better, and the quality of the ferromagnetic material at the barrier interface can also be better because excess oxygen can go to the intergranular matrix rather then ferromagnet nanogranules 1.

There are likely varying degrees of oxidation in the CoFe—rich granules. It is unlikely that there is a sharp interface between CoFe-rich nanogranules and HfO rich intergranular regions.

The magnetic properties of the matrix are not easily measured on an atomic scale. Either intergranular matrix 2 is thin enough to allow good magnetostatic coupling from granule-to-granule, or it may have some ferromagnetic properties that aid in coupling, or there may be regions of physical continuity of CoFe rich material between nanogranules 1. The magnetic moment within ferromagnetic nanocomposite layer 3, on an atomic scale, is sure to vary considerably as a function of position.

Several high quality single layer CoFe—HfO films of thicknesses from 10 nm to 1000 nm have been formed on a $Si_3N_4$ surface using sputter deposition. The film properties have been analyzed using many tools including a Vibrating Sample Magnetometer (VSM), B-H Loop Tracer, SQUID magnetometer, permeameter analyzer, FMR spectrometer, pulse-field stripline tester, X-ray diffractometer (XRD), X-ray fluorescent spectrometer (XRF), scanning electron microscope (SEM), transmission electron microscope (TEM), atomic force microscope (AFM), and magnetic force microscope (MFM). The various analyses reveal that these are ferromagnetic nanocomposite thin films.

Several analytical tools can further confirm the nature of the nanocomposite structure on a near-atomic length scale. Such measurements provide additional information about its detailed physical structure. High Resolution Transmission Electron Microscopy can give cross-sectional views with almost atomic resolution. Electron microbeam diffraction is a technique where spatial resolution of the usual electron diffraction is enhanced by reducing the size of the electron beam. When the beam is rastered over the cross-section of the nanocomposite structure, the diffracted electrons form a distinctive pattern if the beam is incident on a single granule. The diffracted electrons form a concentric circles pattern if the beam is incident upon an amorphous material. Standard X-ray diffractometers provide similar information, but it is difficult to focus the incident beam on a small enough area to be practical as an "imager" of the structure with 1 nm resolution.

A 10 nm thick CoFe—HfO film formed by sputter deposition was found to have a smooth surface, with an rms roughness of 2.4 Å when deposited on a silicon nitride substrate having a rms roughness of 2.0 Å. This high degree of surface smoothness is critical for tunnel junction fabrication, especially when the $Al_2O_3$ barrier is deposited on top of the CoFe—HfO.

Figure 3:
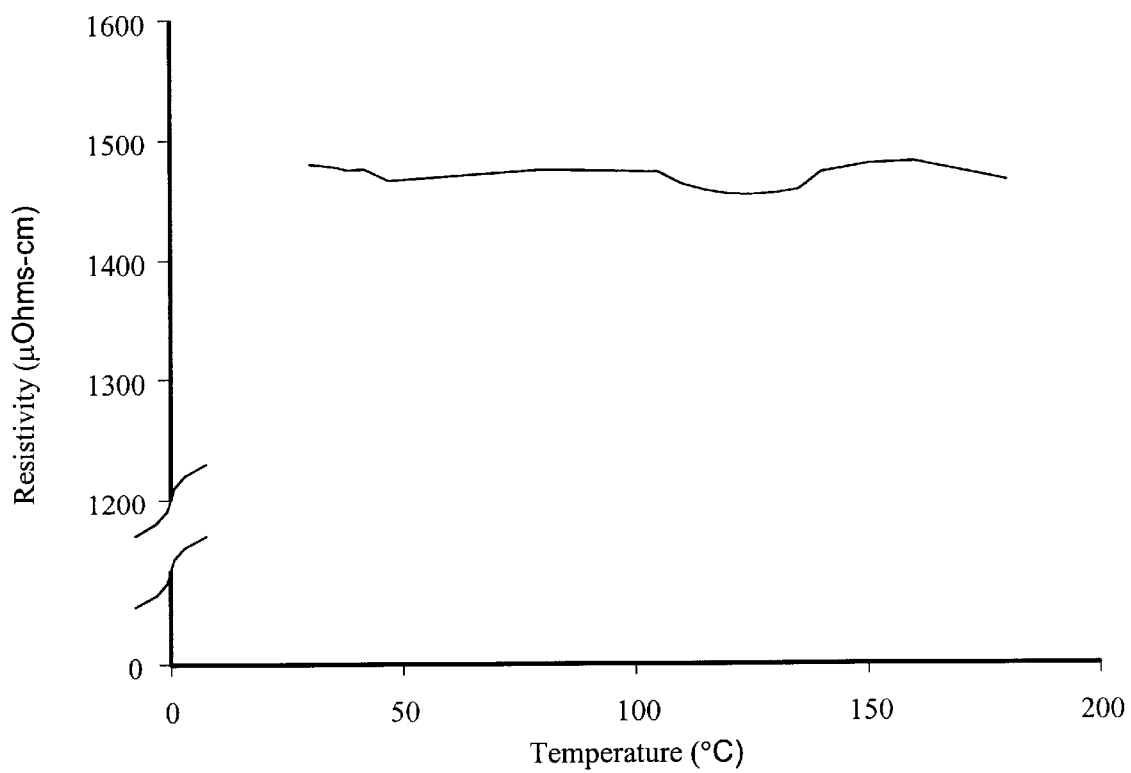
FIG. 3 shows a resistivity vs. temperature characteristic for CoFe—HfO nanocomposite material.

The resistivity of CoFe—HfO has a typical value of 1000 $\mu\Omega$-cm, which changes very little over the temperature range of 20 to 175° C. This temperature dependence is shown in FIG. 3. This high resistivity prevents significant eddy current screening effects for frequencies up to tens of GHz in most applications. The small temperature dependence leads to a small resistive temperature coefficient (TCR) that is desirable for almost all applications.

Figure 1:
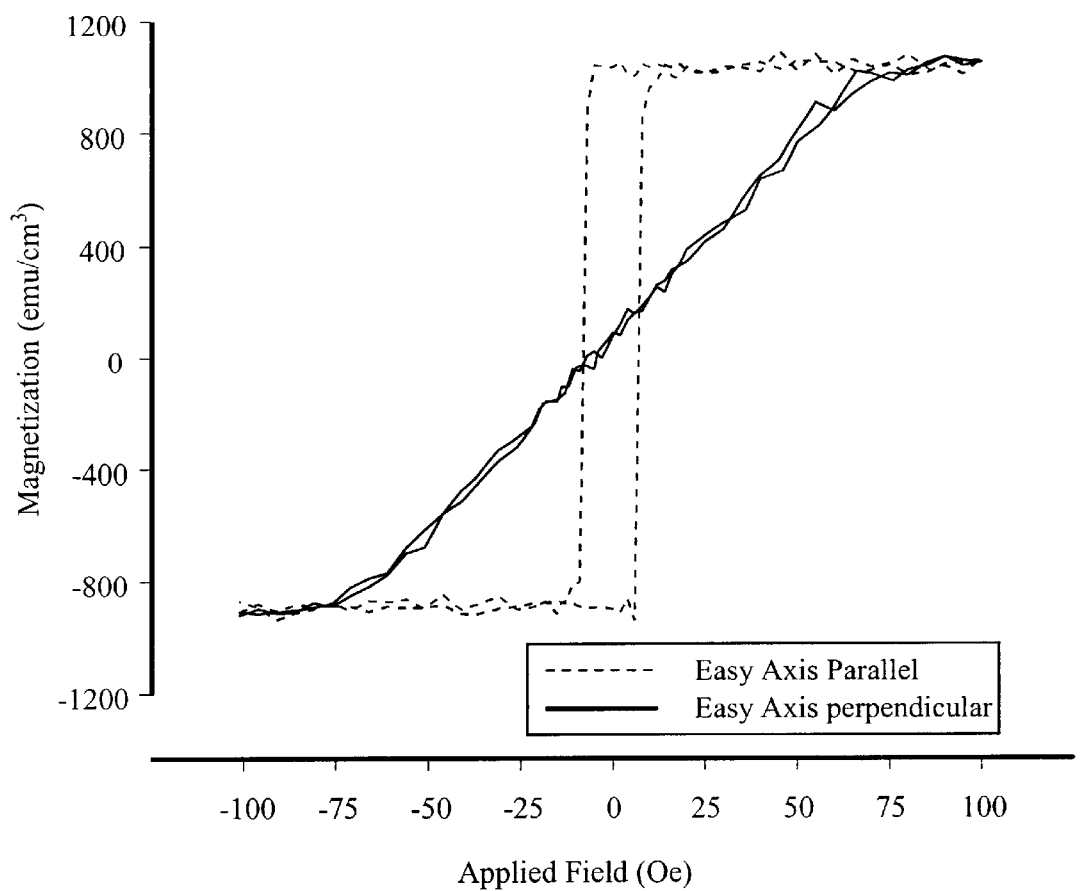
FIG. 1 shows a graph of magnetization vs. applied magnetic field for fields applied along both the easy and hard axes of a bulk CoFe—HfO film.

After being annealed in a magnetic field, such films have excellent soft magnetic properties with a well-defined uniaxial anisotropy. The anisotropy field $H_k$ is typically 65 to 75 Oe for films with thickness ranging from 50 to 200 Å, which is suitable for SDT, spin valve, and other GMR multilayer devices. The saturation magnetization is about 1.2 Tesla. Using the measured anisotropy field and saturation magnetization values, the FMR frequency is calculated to be about 2.2 GHz. Typical hysteresis loops of a 100 Å film show a very square easy axis hysteresis loop, a closed hard axis loop with linear response of magnetization with the field before saturation. The easy and hard axis hysteresis loops of such a 10 nm film are given in the graph of FIG. 1 which shows $4\pi M_s=1.2$ T, an easy axis coercivity of 8 Oe, and a closed hard axis loop with an adequate uniaxial anisotropy field of 65 Oe. A 5.0 nm thick CoFe—HfO film showed similar properties. A comparison of CoFe—HfO with permalloy, the most commonly used class of soft magnetic materials, is given in Table 1 below. The composition of permalloy is Ni 80, Fe 20 (atomic %). Clearly, CoFe—HfO is better than permalloy for each of these properties that are particularly important for high rate of operation devices.

TABLE I

Primary High operating rate properties of CoFe—HfO and permalloy

| Material | $4\pi Ms$ | Hk | F (FMR) | Resistivity |
|---|---|---|---|---|
| NiFe | 1.0 T | 3.5 Oe | 0.4 GHz | 20 $\mu\Omega$-cm |
| CoFe—HfO | 1.2 T | 75 Oe | 2.2 GHz | 1k $\mu\Omega$-cm |

Permeameter measurements on single layer CoFe—HfO films result in weak signals so that much of the data has to be averaged to get more accurate values for the initial permeability, FMR frequency and damping constant. FMR spectra have also been taken and the initial permeability and the precessional frequency have been calculated from the FMR data and compared with the observed values. These calculated values included the anticipated effects of eddy currents based on the sample thickness and the resistivity. The permeability measured here is as defined earlier, $\mu=[4\pi M/H]$. This is simply a measure of the response of M to an applied field H. The permeability measurements were made with oscillating excitation fields of constant amplitude ranging in frequency from 100 MHz to 3 GHz. The result of the measurement is that the precession frequency is about 2.2 GHz, and the permeability is about 200, both of which compare well with theoretical calculations based on the static magnetic properties. The damping constant, $\alpha$, is relatively small, 0.005 for a 10 nm sample, compared with 0.02 for permalloy. It is also observed that this value increases with the film thickness, to 0.02 at 3000 Å and 0.04 at 1 $\mu$m as measured using a permeameter. With the large material resistivity value, the effects of eddy currents on the permeability and the precessional frequency are minimal.

Figure 4A:
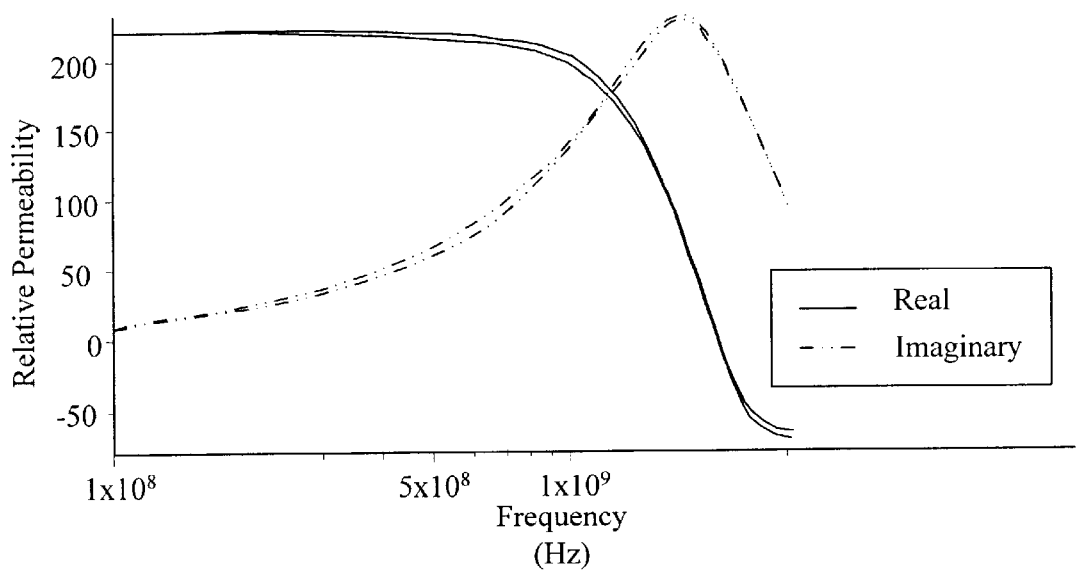
FIGS. 4A and 4B show graphs of calculated permeability vs. frequency for CoFe—HfO nanocomposite material and measured permeability vs. frequency for CoFe—HfO nanocomposite material.
Figure 4B:
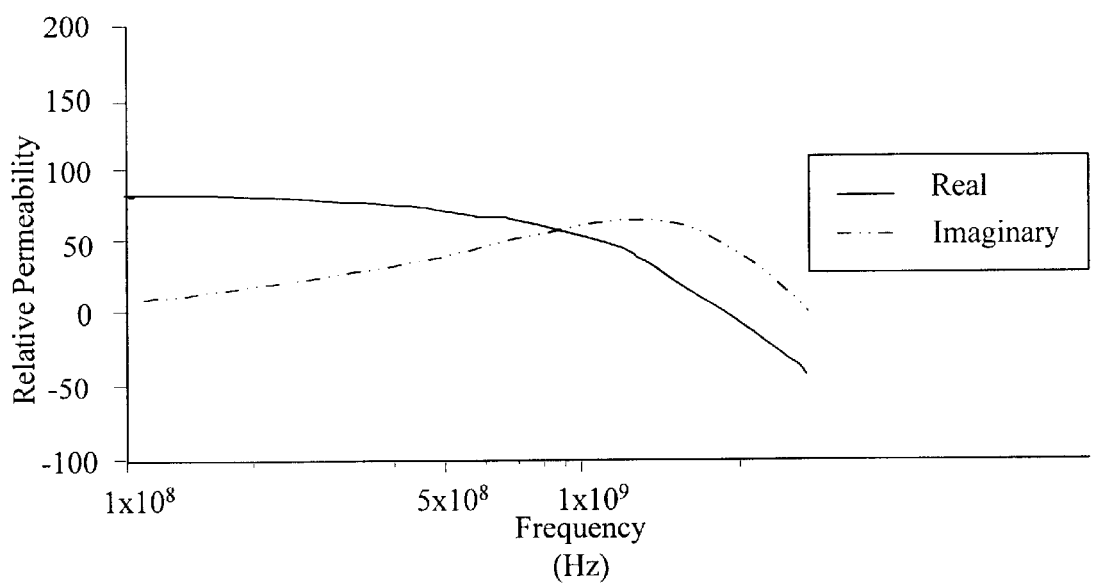

FIG. 4A and FIG. 4B show predicted and measured, respectively, permeameter spectra for a 1000 nm thick CoFe—HfO film. The solid lines are the real part of the permeability, while the dashed lines are the imaginary part.

Figure 5:
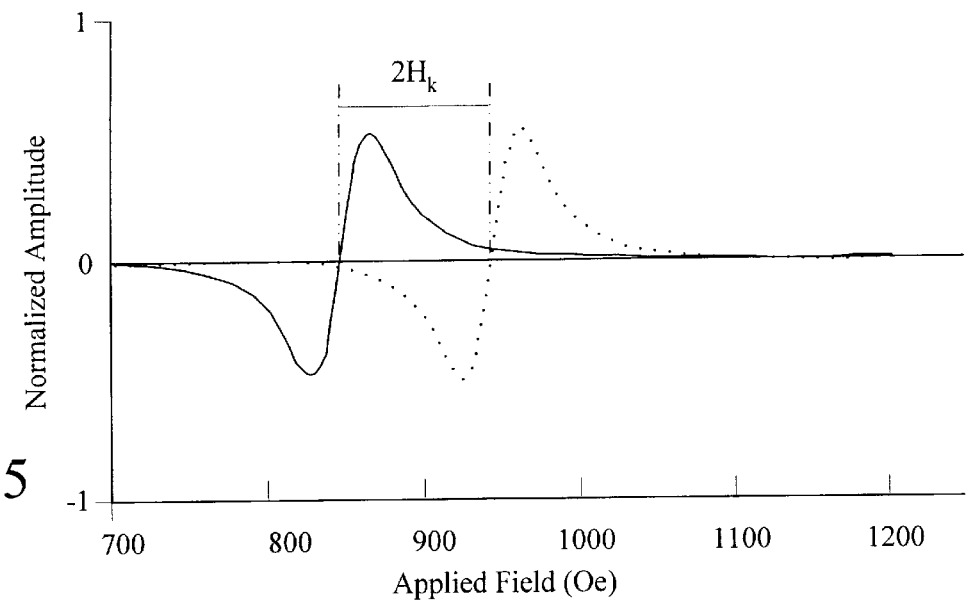
FIG. 5 shows a graph of ferromagnetic resonance response vs. applied field for CoFe—HfO nanocomposite material 20 nm thick.

FIG. 5 shows the FMR spectra for a 200 Å thick CoFe—HfO film. While the field indicated on the x-axis of the plot is swept from 700 Oe to 1200 Oe, a much smaller 9.386 GHz field is applied perpendicular to the DC applied field. The signal indicated by the solid curve is the result when the DC applied field is parallel to the easy axis while the dashed curve is the result when the DC applied field is parallel to the hard axis. Some simple math shows that the separation in field between the zero crossing of these two curves is twice $H_k$, as indicated on the plot.

Figure 6:
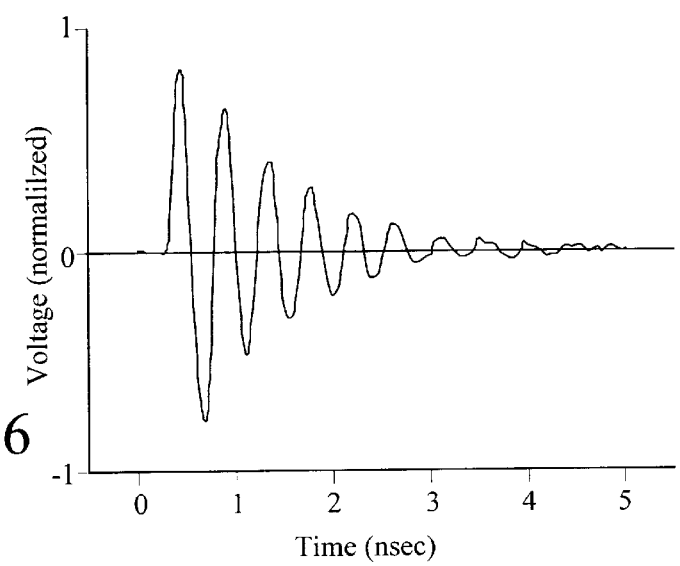
FIG. 6 shows a graph of inductively sensed response of CoFe—HfO nanocomposite material to a step function applied magnetic field.
Figure 7:
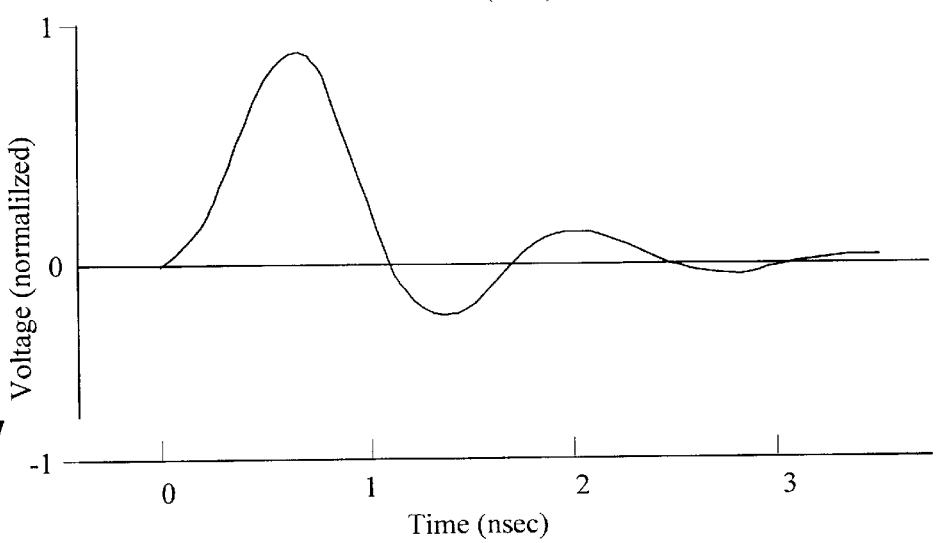
FIG. 7 shows a graph of inductively sensed response of NiFeCo material to a step function applied magnetic field.

Pulsed magnetic field measurements using an inductive stripline technique have been performed with the stripline excited by a source to supply a film hard-axis magnetic field excursion of 3.3 Oe with a field rise time of 0.3 ns in the absence of any easy axis field. The measured response is proportional to the time derivative of the magnetization along the film hard axis with the results for a 100 nm CoFe—HfO film shown in the graph of FIG. 6. In comparison, a similar plot is given in FIG. 7 for a typical permalloy film. Note that the period of the free oscillations, or "ringing", is ~0.4 ns for the CoFe—HfO film and ~1.7 ns for the permalloy film. These values correlate well with the permeameter and FMR measurements. Note that in all three high rate analyses shown in FIGS. 5–7, the resulting oscillation of magnetization is not full precession. Rather, the magnetization is oscillating through small angles about the easy axis.

Figure 8A:
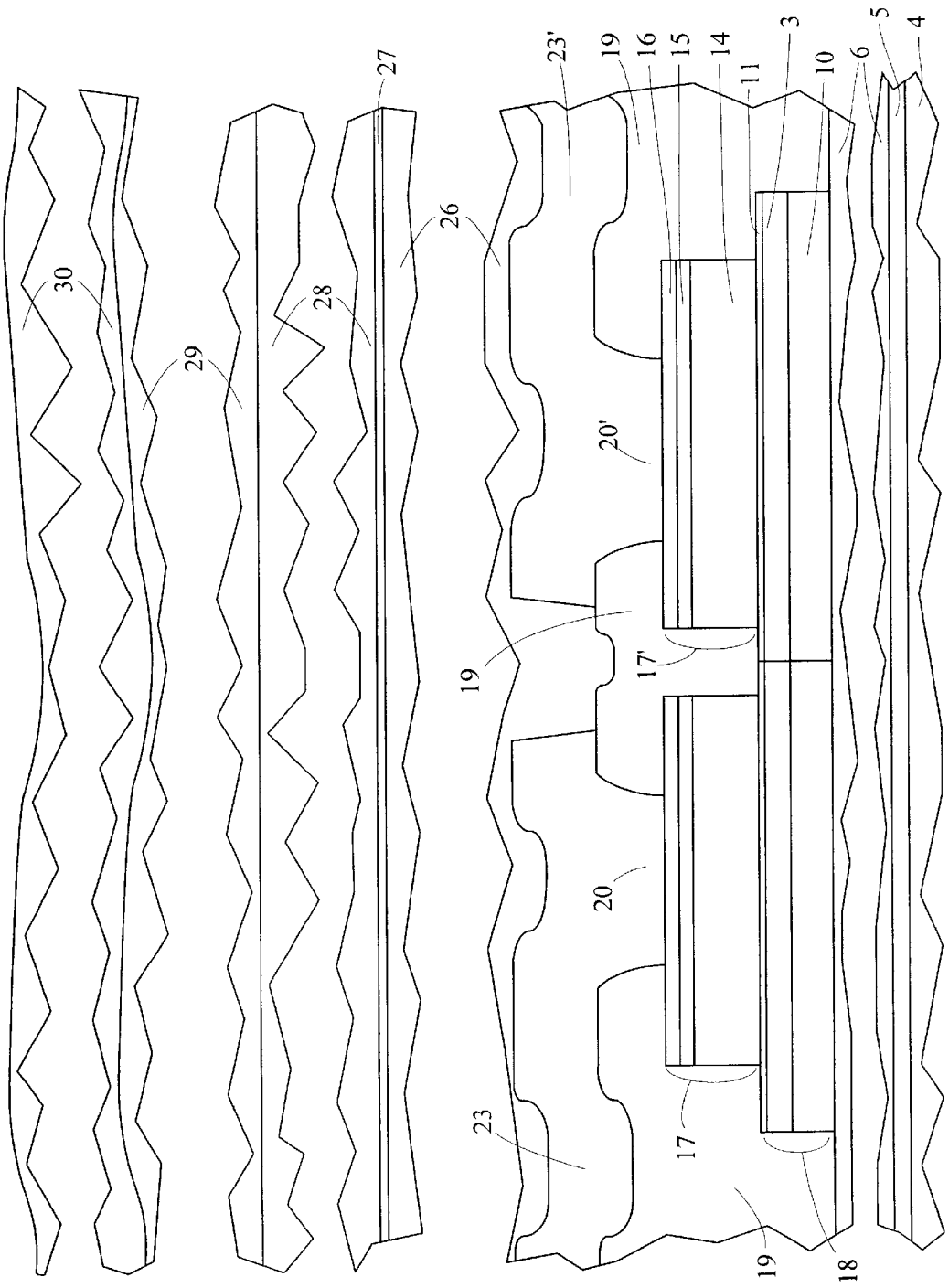
FIGS. 8A and 8B show layer diagrams of a pair of SDT junction devices contained in a magnetoresistive signal isolator device and an interconnection to another interconnection in the underlying monolithic integrated circuit.
Figure 8B:
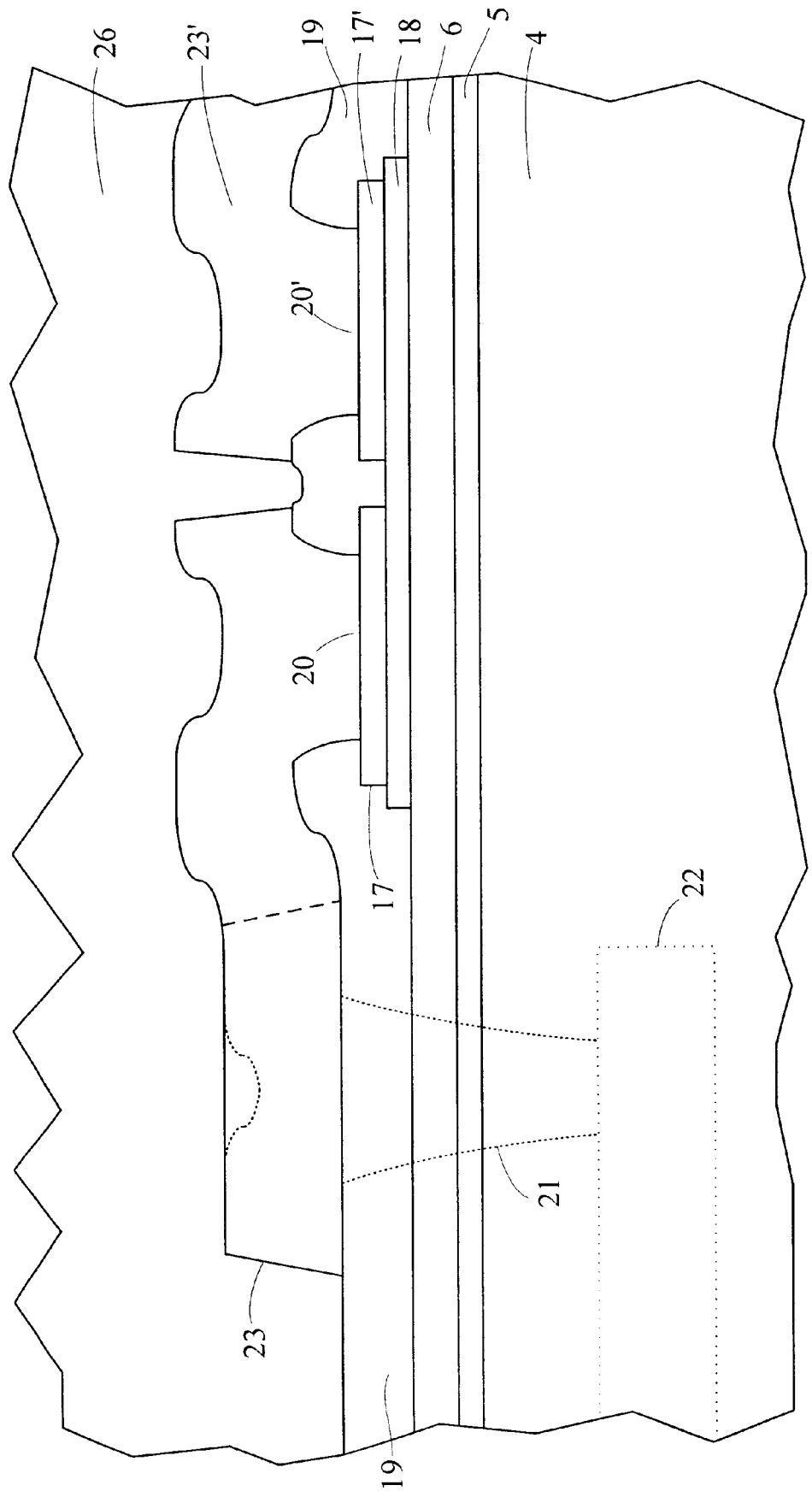

CoFe—HfO films with properties as shown above are ideal for incorporation into magnetoresistance based high operating rate circuit device structures as the magnetic free layer. The formation of such a structure is described here. The strata shown in FIG. 2A must be further processed in order to fabricate useful magnetoresistive structures on monolithic integrated circuit 4. The result of a typical SDT junction fabrication process is illustrated in FIGS. 8A and 8B. Prior to any etching, a conductive 10 nm thick Al buffer layer 15, a 10 nm thick CrSi etch stop layer 16, and 75 nm thick $Si_3N_4$ hard-mask layer (not shown, as it is subsequently removed) are formed onto magnetically hard layer 14 using sputter deposition. A photoresist mask is created, using standard photolithographic techniques, on the surface of the hard-mask layer which is then etched using reactive ion etching (RIE). The RIE removes unmasked material down to etch stop layer 16. The photoresist mask is removed, and the wafer is further etched in an ion mill. Top electrodes of tunnel junctions 17 and 17' are formed once the ion mill removes unmasked material down to tunnel barrier 11, and also the 75 nm hard mask layer from the masked areas. Bottom electrode 18 is formed using a similar process to mask and etch exposed tunnel barrier 11, free layer 3, and buffer layer 10, stopping on or within $Si_3N_4$ layer 6.

Tunnel junctions 17 and 17' are passivated by sputter deposition of 100 nm thick Si3N4 layer 19. Contact windows 20 and 20' are formed in passivation layer 19 using lithography and RIE. Via 21 to metal layer 22 in the integrated circuit structure 4 is also formed this way. Aluminum interconnections 23 and 23' are formed by patterning, using photolithography and RIE, a 100 nm layer of Al that has been formed using sputter deposition onto passivating layer 19 and into windows 20 and 20', and via 21. Thus, two tunnel junctions 17 and 17' having a magnetically hard layer 14 share common bottom electrode 18, which has the free magnetic layer 3. While it is not necessary to have two top electrodes per bottom electrode, this arrangement provides for better use of physical space and an easier fabrication process.

At this point, the magnetoresistive properties of the SDT devices can be tested. The tunnel resistance between the two magnetic layer electrodes on either side of the insulating barrier layer depends on the relative angle of the two magnetic layer electrode magnetizations. The resistance is relatively low when the two magnetizations are parallel, and relatively high when antiparallel. The top magnetic layer 12, typically FeCo, is pinned using an antiferromagnetic layer 13, typically CrPtMn, positioned immediately next to it. Under small external magnetic fields, less than several hundred Oe, the pinned layer magnetization direction changes little. Therefore, an electrical signal can be obtained between the two electrodes by manipulating the magnetization direction of the free layer 3.

Figure 9:
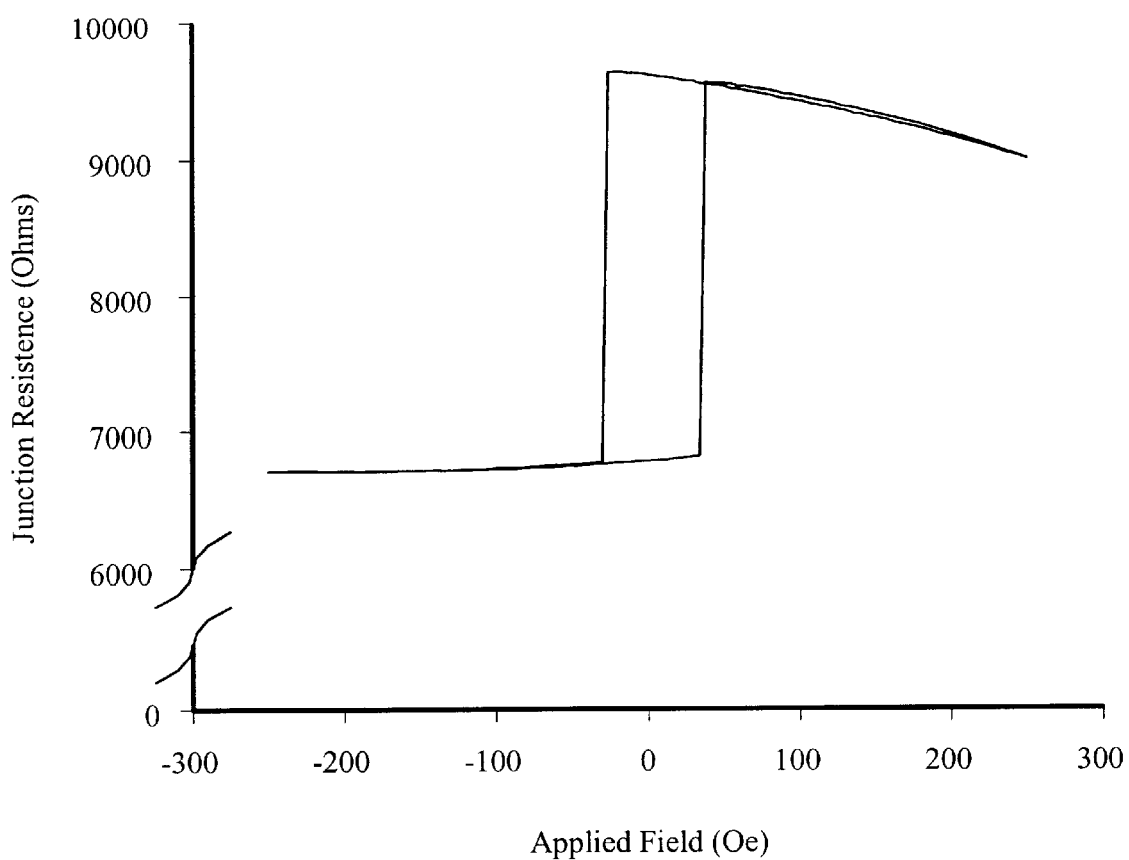
FIG. 9 shows a graph of tunnel junction resistance vs. applied magnetic field for a SDT junction device having a CoFe—HfO free layer therein.

The typical form of the SDT junction versus applied magnetic field characteristic is shown in FIG. 9. The external field is applied along the easy axis. The junction exhibits a 44% magnetoresistance ratio. This junction has CoFe—HfO as magnetically free layer 3. It's lateral dimensions are 33 $\mu m \times 25$ $\mu m$, and the resistance-area product (RAP) is 5.5 $M\Omega$-$\mu m^2$. The RAP is a property of the tunnel barrier, and should be the same regardless of the size of a device on a given wafer.

Figure 10A:
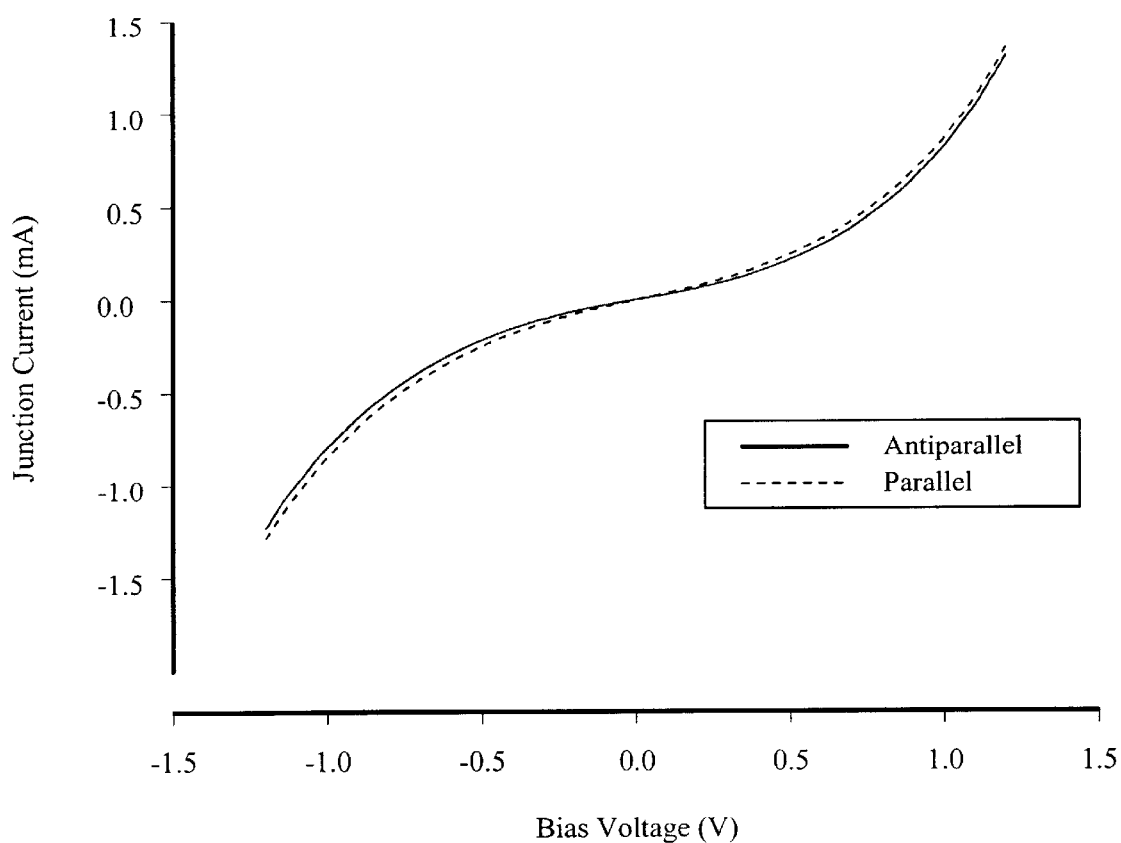
FIGS. 10A, 10B and 10C show graphs of tunnel junction parameters vs. bias voltage for a SDT junction device having a CoFe—HfO free layer therein.
Figure 10B:
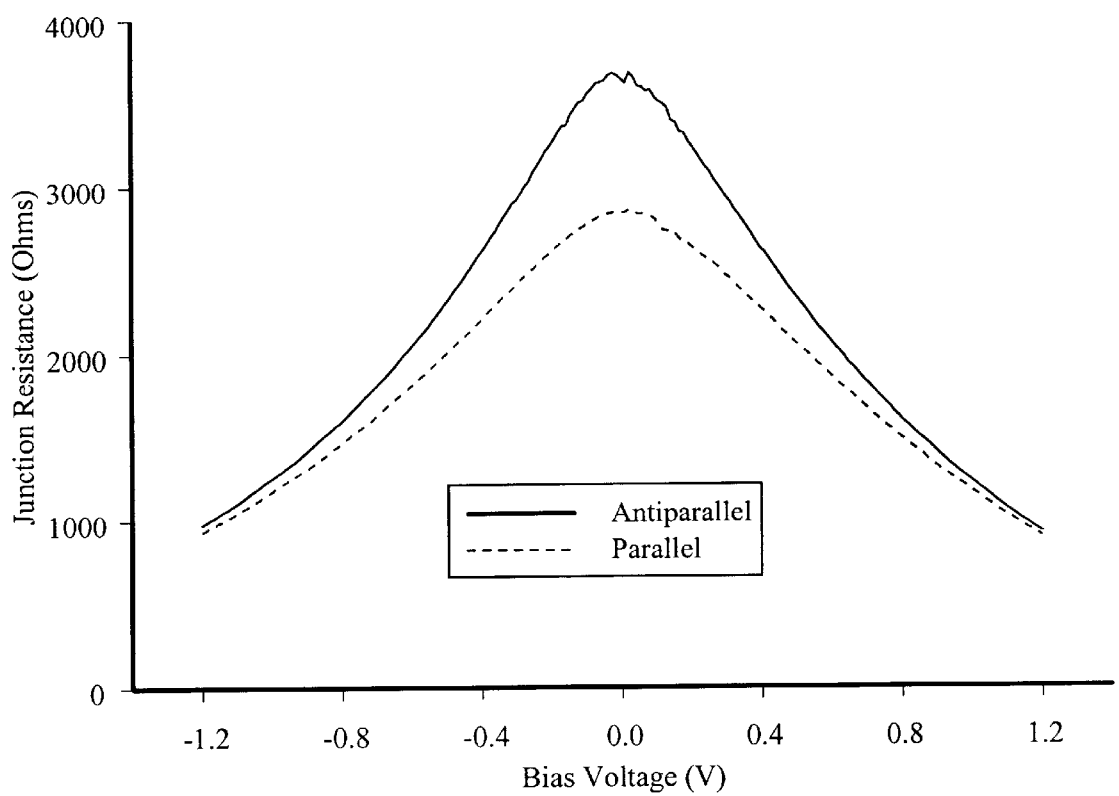
Figure 10C:
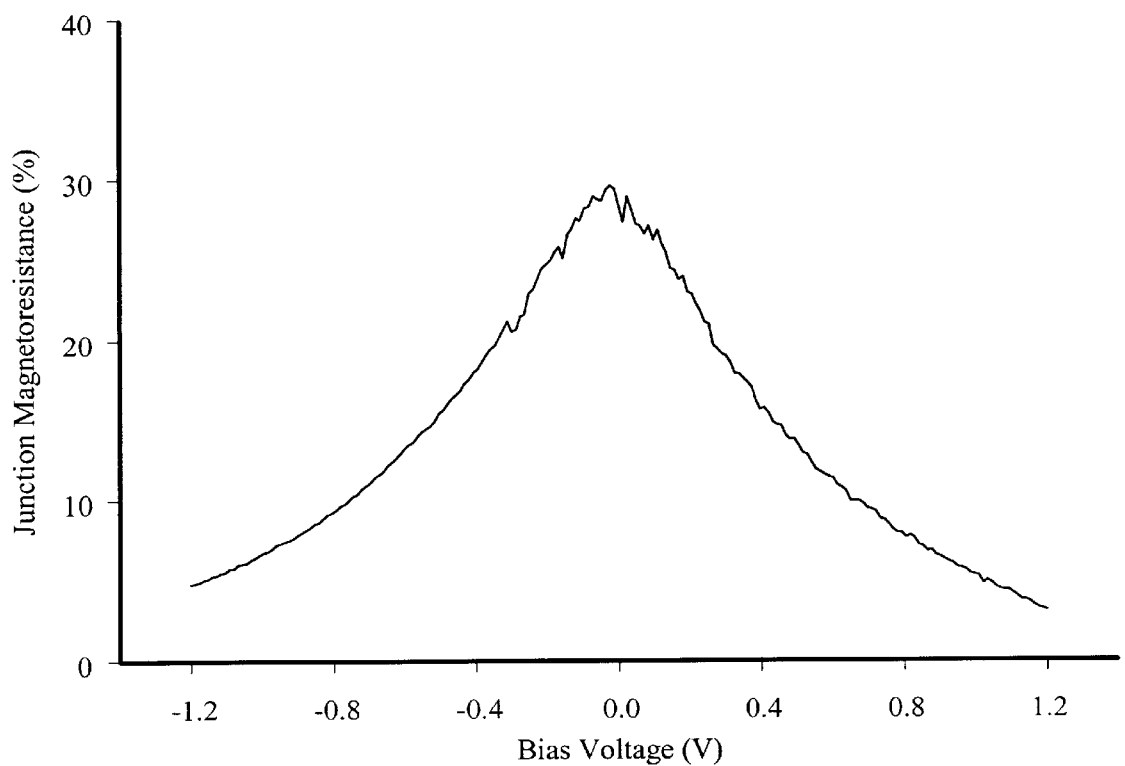

The dependences of the magnetic tunnel junction properties as a function of bias voltage across the junction are shown in FIG. 10. In FIG. 10A, the dependence of the tunneling current on the junction bias voltage is shown for the magnetizations of the magnetic layer electrodes being parallel and antiparallel. In FIG. 10B, the dependence of the junction resistances on the junction bias voltage is shown for the magnetizations of the magnetic layer electrodes being parallel and antiparallel. In FIG. 10C, the dependence of the magnetoresistance ratio on the junction bias voltage is shown. The bias voltage, $V_{1/2}$, across the junction at which the magnetoresistance ratio is half of the maximum is about 450 mV. This is similar to that resulting from a similar structure in which NiFeCo replaces the CoFe—HfO shown here. For the particular junctions characterized in FIGS. 9 and 10, the RAP value is too high to operate at 1 GHz. However, the high magnetoresistance of these junctions demonstrate that CoFe—HfO has a high spin-polarization and is compatible with $Al_2O_3$ barrier, which are keys for high performance SDT tunnel junctions. The RAP can be reduced making the barrier thinner, or by using an aluminum nitride (AlN) barrier instead of $Al_2O_3$.

Figure 11:
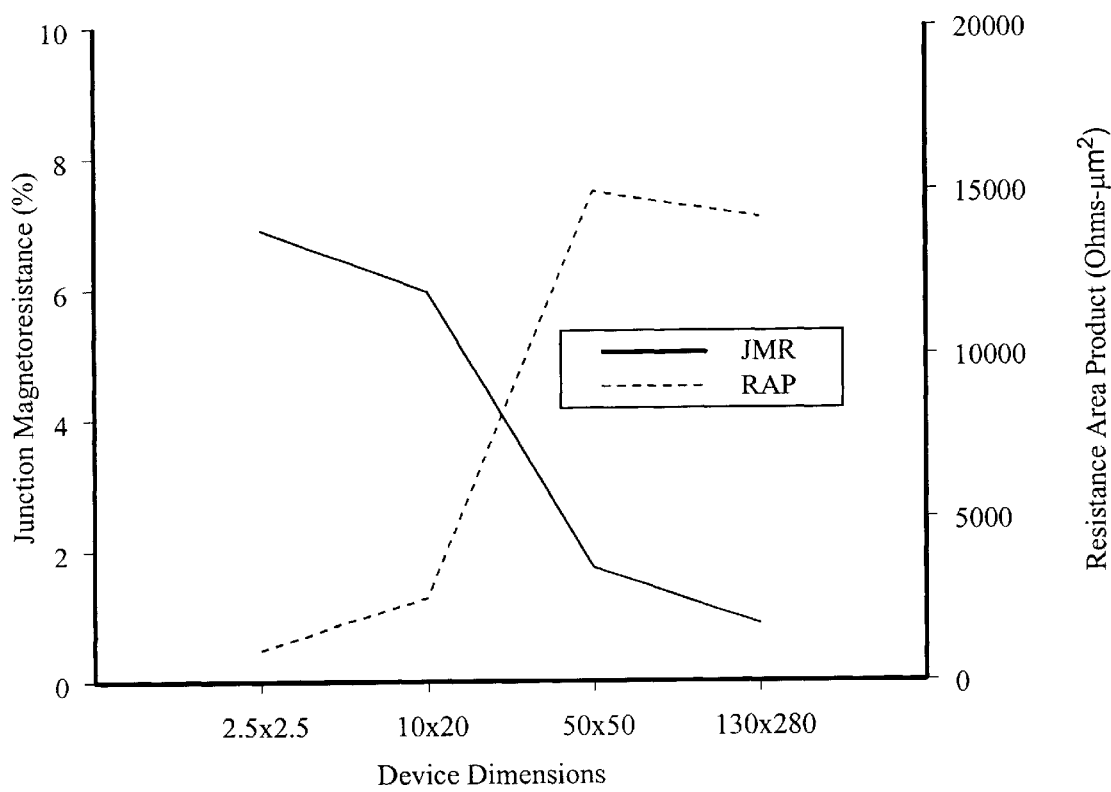
FIG. 11 shows a graph of tunnel junction parameters vs. junction size for CoFe—HfO nanocomposite material layer therein with an aluminum nitride barrier.

FIG. 11 gives the device size dependence of the magnetoresistance ratio and RAP values for SDT devices made with AlN tunnel barriers. A small 2.5×2.5 mm junction with layer structure Si(100)/$Si_3N_4$/Ta 4/Cu 10/Ta 2/CoFe—HfO 10/AlN/FeCo5/CrPtMn 30 (all thicknesses in nm) has a low RAP value of 958 $\Omega$-$\mu m^2$. However, the magnetoresistance ratio has a relatively low value of 6.9%. The dependence of measured magnetoresistance and RAP vs. junction size is due to uneven current distribution across the tunnel barrier. The lateral current flow in the electrodes required for the current to reach all areas of those electrodes. This is a parasitic series resistance to the tunnel junction which reduces the measured magnetoresistance ratio thereby giving an erroneously low indication of the junction performance in larger devices with a low RAP.

Figure 12:
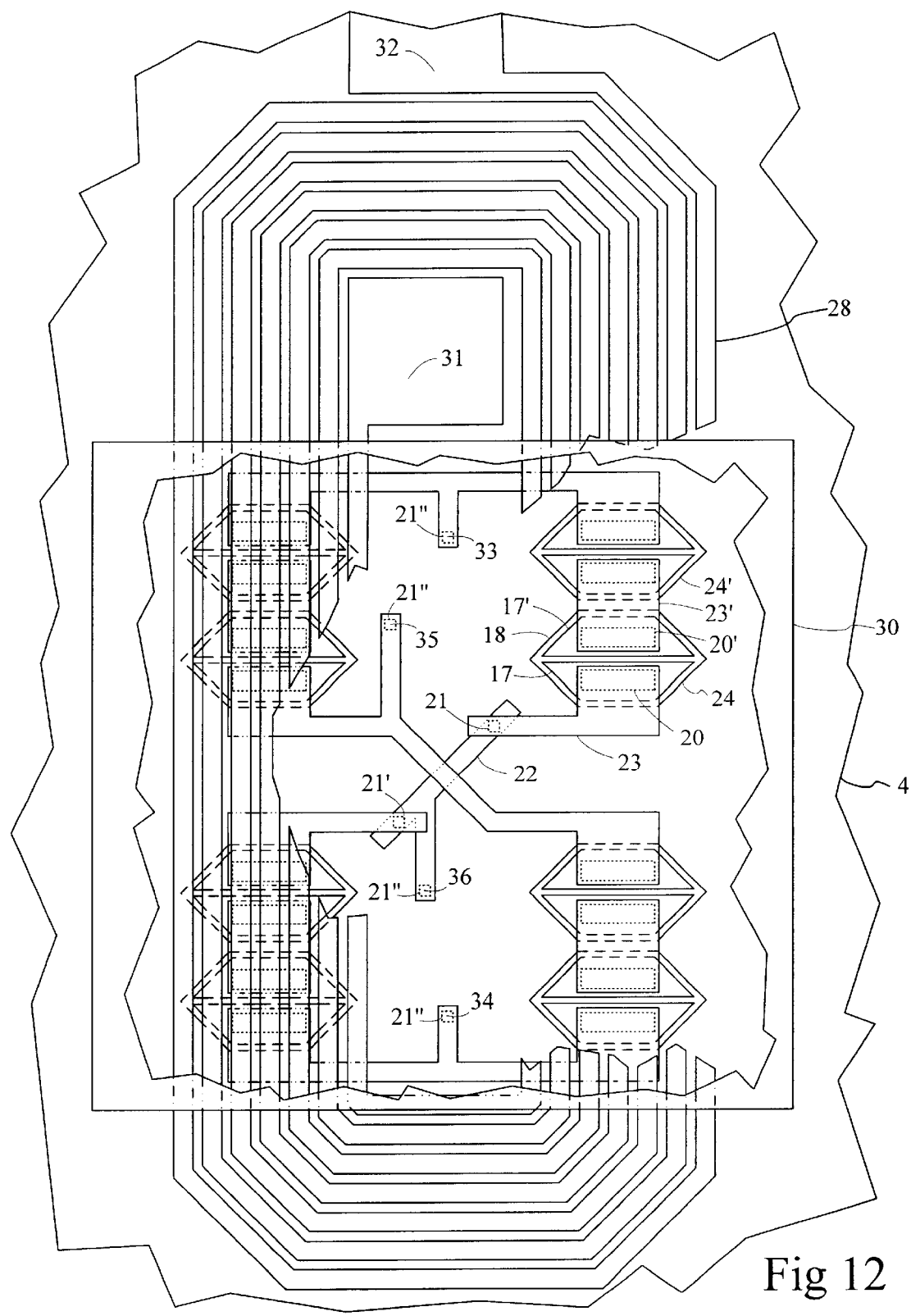
FIG. 12 shows a top view of a portion of a monolithic integrated circuit containing a SDT junction device having CoFe—HfO layers therein.
Figure 13:
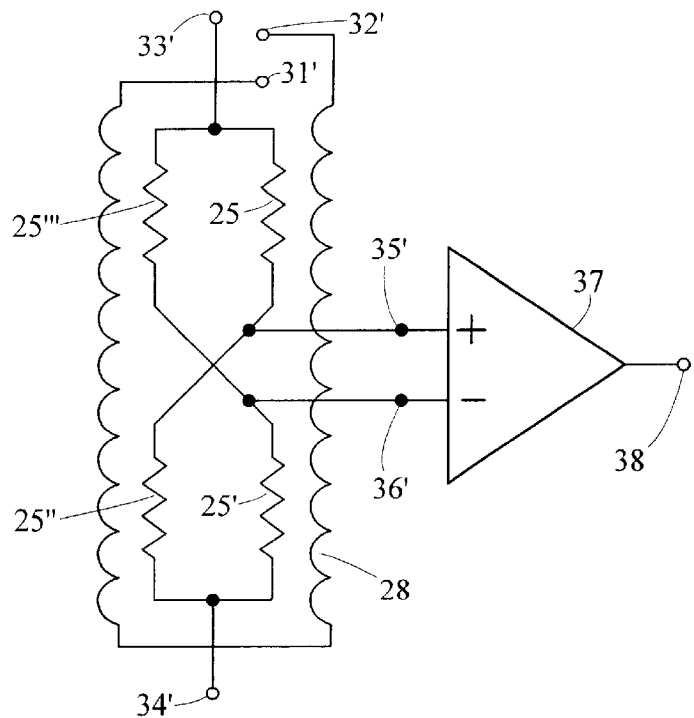
FIG. 13 shows a circuit diagram of a bridge circuit formed with SDT junction devices having CoFe—HfO layers therein connected to the inputs of an amplifier for a monolithic integrated circuit signal isolator.

Multiple SDT junction pairs can be electrically connected in series to form a resistance "leg" that can have a higher total voltage that can be applied to it than to a single junction or junction pair. This is often done in circuits where the supply voltage is much higher than the 100 mV that is safe to put across a single junction. A typical SDT circuit device is formed of a resistance bridge containing four SDT resistor legs and associated conditioning electronics. FIG. 12 shows the plan view of a monolithic integrated circuit based magnetoresistive signal isolator based on a resistance bridge. FIG. 13 shows a simple schematic of the bridge plus amplifier arrangement.

The two junctions 17 and 17' on bottom electrode 18 (see FIG. 8B) together form junction pair 24. Two such pairs, 24 and 24' form bridge leg 25 which contains two junction pairs, or four tunnel junctions. Four such bridge legs, 25, 25', 25", and 25'", are electrically connected using interconnections 23, 23', vias 21 and 21' to metal interconnect 22. The integrated circuit substrate 4 supports this SDT resistance bridge. An electrical isolation barrier 26 and surface conditioner 27 are provided on top of SDT interconnects 23 and passivation layer 19 and directly supporting 1.5 micron thick Al planar coil 28. A second isolation barrier 29 separates coil 28 from permalloy shield 30. Isolation barrier 26 is formed to a thickness of 2 microns to 18 microns by performing the following sequence one or more times: spin-coat with BCB followed by prescribed soft bake. The top surface of BCB isolation barrier 26 supports 500 nm $Si_3N_4$ surface conditioning layer 27 formed by sputter deposition. The thickness of isolation barrier 26 is determined by the required standoff voltage for a given electrical isolation application. A typical requirement is for 2500 Volts standoff, for which 18 microns of BCB is required. Planar coil 28 is formed by standard photolithography and RIE etching 1.5 microns of sputter-deposited Al.

The function of the isolator structure is to pass information in electronic format without having a true electrical connection. The magnetoresistive thin film based signal isolator performs this function by converting an electric signal at inputs 31 and 32 into a magnetic field which is converted back to an electric signal by the SDT bridge and its output circuitry. The input signal current through coil 28 generates magnetic fields in a direction over bridge legs 25, 25', that is antiparallel to that over bridge legs 25" and 25'". Due to the asymmetric nature of the transfer curve in FIG. 9, the resistance of bridge legs 25, 25', will be in the high state when that of bridge legs 25" and 25'" is in the low state, and visa versa.

Vias 21" contain metallized connections to integrated circuit components below. Connections 33 and 34 connect the SDT bridge to positive terminal 33' and negative terminals 34', respectively, of a voltage or current source. Connections 35 and 36 connect the SDT bridge output leads to input terminals 35' and 36' of signal amplifier 37. The electrical signal from amplifier 37 is available at output terminal 38.

Spin valve structures are similar to a SDT structures, but have a conducting spacer layer, e.g. Cu, in place of the insulating $Al_2O_3$ tunnel barrier in SDT structures. They exhibit the "giant magnetoresistive effect" rather than the "spin dependent tunneling" effect. In patterning spin valve material, only one etch step is needed instead of two as for SDT structures. The current path in spin valve structures primarily follows the film plane instead of flowing perpendicular to that plane as in SDT structures (there can be spin valve structures with current flowing perpendicular to the film plane although they are not commonly used at present).

Figure 14:
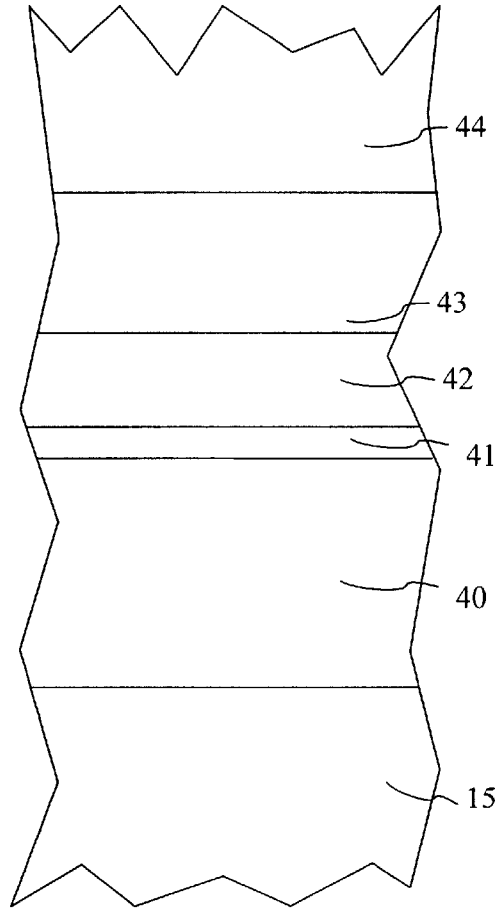
FIG. 14 shows a layer diagram of a GMR spin valve device having a CoFe—HfO free layer therein.
Figure 15A:
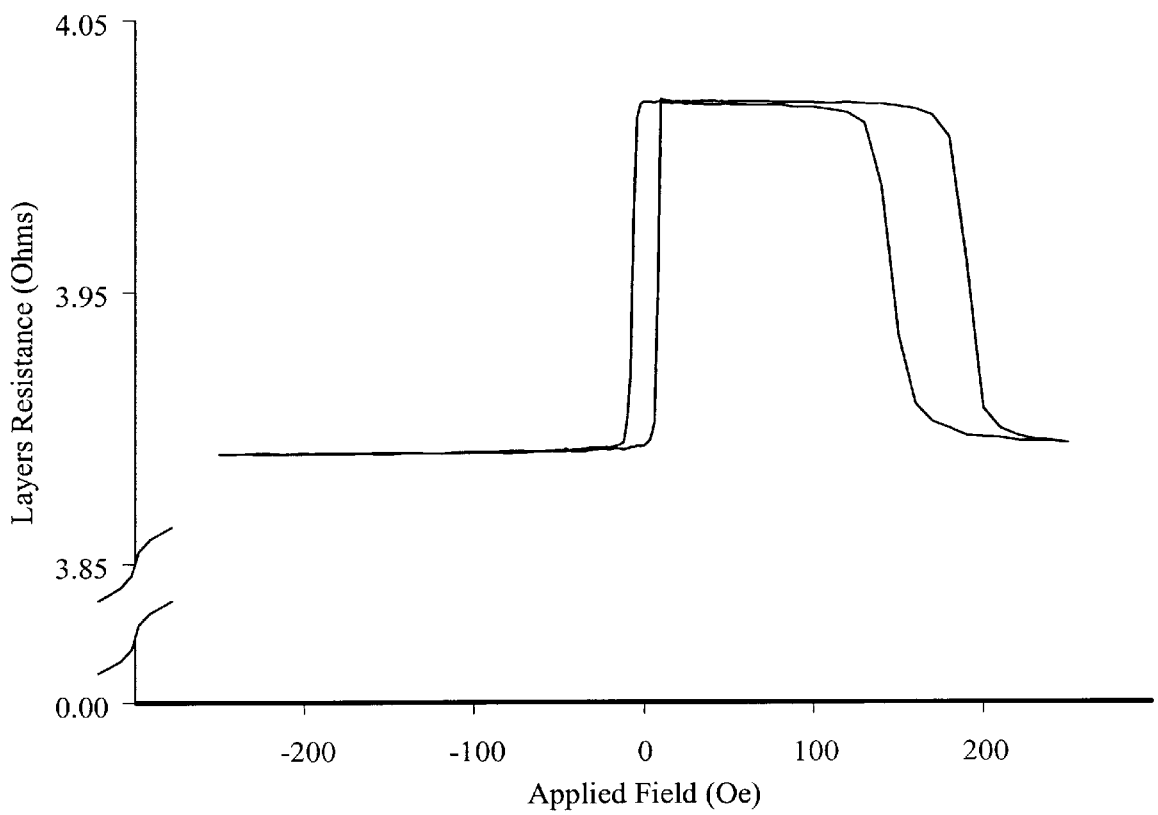
FIGS. 15A and 15B show graphs of major and minor response loops to applied magnetic fields of the GMR spin valve device of FIG. 14.
Figure 15B:
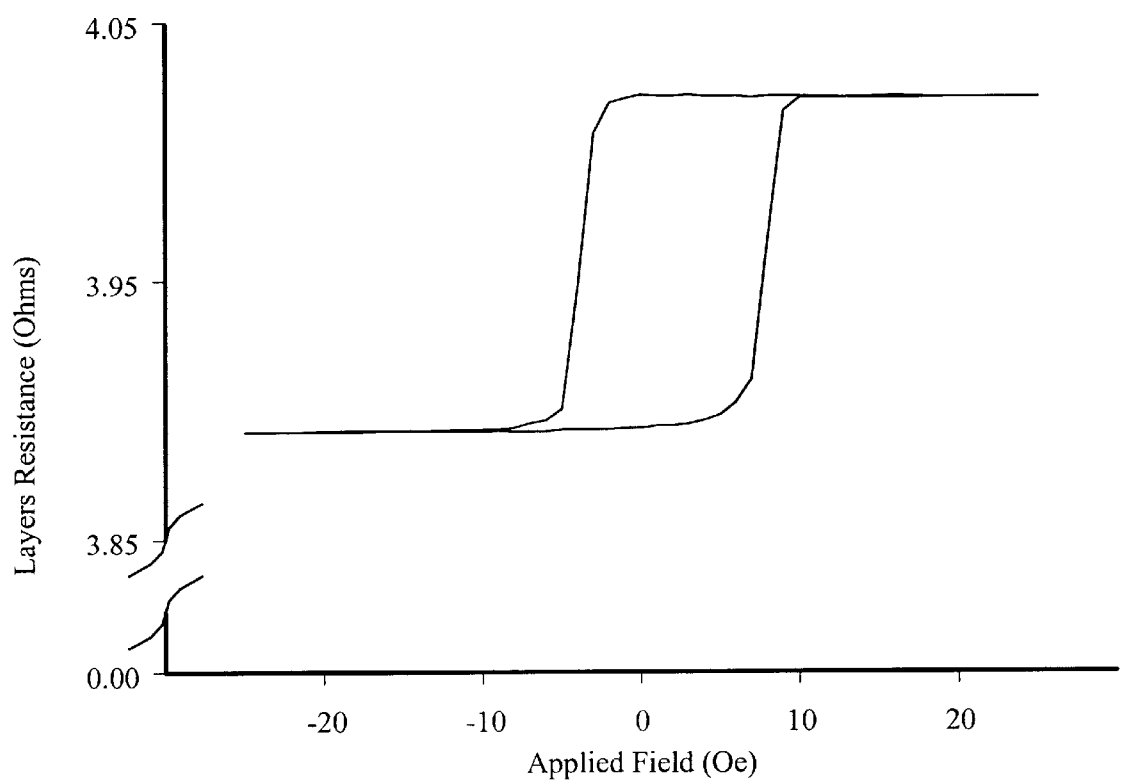

Spin valve devices for high rate of operation applications can be made using CoFe—HfO layers as magnetic free layers as shown in layer view FIG. 14. All of the layers in this magnetoresistive stack are provided by sputter deposition onto $Si_3N_4$ substrate 15. From bottom to top, the stack consists of 5 nm CoFe—HfO free layer 40, 1 nm CoFe interface layer 41, 3.5 nm Cu intermediate layer 42, 5 nm CoFe pinned layer 43, and 300 nm CrPtMn pinning layer 44. Typical resistance versus applied field traces (resistance represented by voltage since a constant current is used to measure the resistance) are shown in FIGS. 15A and 15B. A wide range externally applied magnetic field result is shown in FIG. 15A, and a near zero range externally applied field result is shown in FIG. 15B. The magnetoresistive properties are qualitatively similar to those of spin valves using permalloy and other common ferromagnetic materials.

Figure 16:
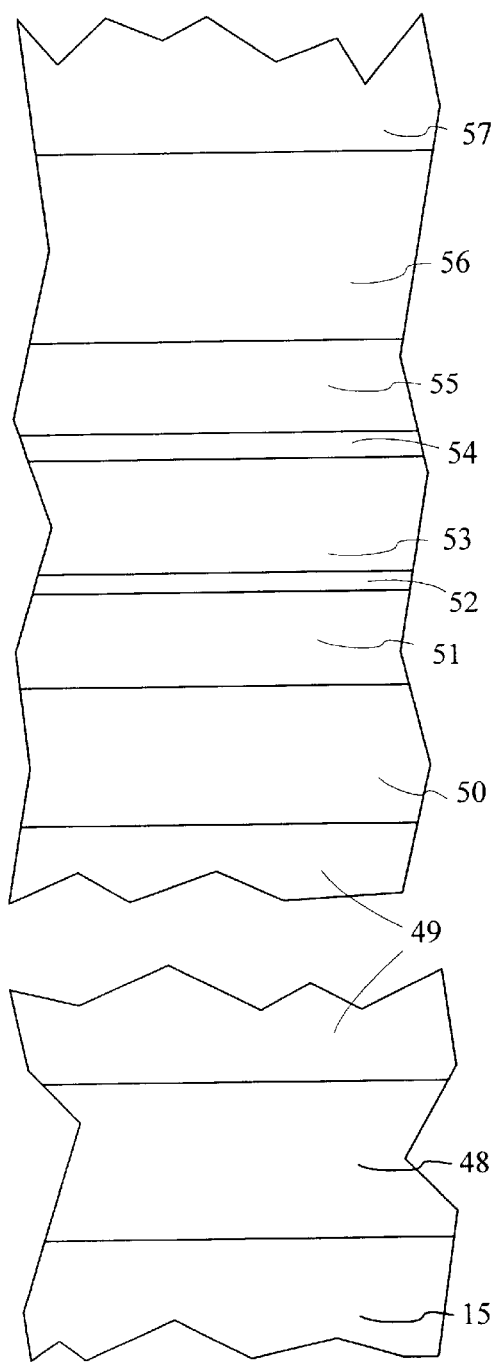
FIG. 16 shows a layer diagram of a GMR symmetric spin valve device having a CoFe—HfO free layer therein.

With a CoFe—HfO/CoFe ratio of 50/10 for the magnetic free layer, the magnetic performance will be dominated by the CoFe—HfO layer while the CoFe layer enhances the magnetoresistance value by assuring substantial spin polarization at the interface with the intermediate copper layer. Although the magnetoresistance values can be further improved, the results demonstrate the use of nanocomposite CoFe—HfO in a spin valve structure. CoFe—HfO can also be used in other GMR structures such as a symmetric spin valve structure shown in FIG. 16 with three magnetic layers separated from one another by two nonmagnetic layers. All of the layers in this magnetoresistive stack are provided by sputter deposition onto $Si_3N_4$ substrate 15. From bottom to top, the stack consists of 5 nm permalloy buffer layer 48, 30 nm CrPtMn pinning layers 49 and 57, 5 nm CoFe pinned layers 50 and 56, 3.5 nm Cu non-magnetic intermediate layers 51 and 55, 1 nm CoFe interface layers 52 and 54, and 6 nm CoFe—HfO layer 53, The middle ferromagnetic strata 52, 53, and 54 form the magnetic free layer and the outer strata 50–51 and 56–57 are pinned magnetic layers.

The high operating rate benefit of using CoFe—HfO as the magnetic free layer of a "spin valve" would be just as described for SDT structures. Furthermore, state of the art magnetoresistance techniques such as specular scattering, interface dusting, and coupling controls can all be applied to any of the GMR structures having CoFe—HfO layers therein. Vertical GMR (VGMR) multilayer structures, having current flowing perpendicular to plane (CPP), can be improved by replacing low resistivity ferromagnetic material layers (permalloy, for example) in currently used structures with high resistivity CoFe—HfO. The magnetic hardness of CoFe—HfO layers can be varied by making them thicker (harder) or thinner (softer). The nonmagnetic material layers (spacers) can be of a good conductor such as Cu. This structure can be used to form magnetoresistive memory (MRAM) cells with the stored information kept in the thicker hard layers that are "read" by switching the magnetizations of the thinner or softer layers. Whether the resistance increases or decreases tells whether they are magnetized parallel or antiparallel to one another.

Figure 17:
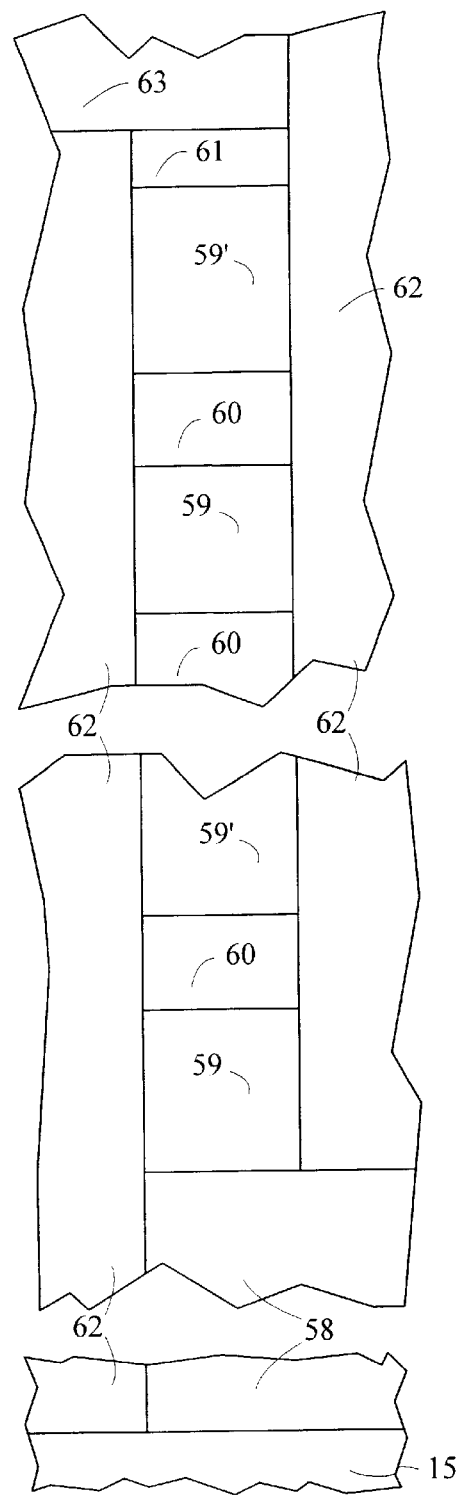
FIG. 17 shows a layer diagram of a GMR multilayer device having CoFe—HfO alternating hard and soft layers therein.

A typical structure for vertical conduction would have n repeats of the [thick CoFe—HfO/Cu/thin CoFe—HfO Cu] structure, with n=2 to 8. A layer view of the construction of such a structure is represented in FIG. 17. Substrate 15 supports 100 nm Cu base layer 58 followed by alternating 6 nm and 9 nm CoFe—HfO layers 59 and 59' separated by 3.5 nm Cu layers 60. On top of the uppermost CoFe—HfO layer 59', a 100 nm Cu interconnect layer 61 is deposited. Lithography and etching down to Cu base layer 58 results in a narrow structure with lateral dimension of about 100 nm and height of several hundred nm. A second etch removes additional material from Cu base layer 58 to form an interconnect structure. A 200 nm passivating $Si_3N_4$ layer 62 is deposited, and polished back using Chemical Mechanical Polishing until Cu interconnect 61 is exposed. Subsequent deposition and patterning of Al interconnect 63 forms a high aspect ratio magnetoresistive structure that is ideal for vertical transport.

A similar structure can also be used in magnetic field sensor devices though the thickness ratio of the two magnetic layers and the lateral dimensions of the devices may be different. There is a substantial need for a high resistivity VGMR multilayer stack because of the large area under the upper interconnection contact to that stack and short path followed by current conducted through that stack. Because of this vertical conduction nature in VGMR structures, there is no shunting by highly conductive nonmagnetic material layers positioned between the magnetic layers since the current path is across these layers rather than parallel to them. For this reason, Cu is suitable as a nonmagnetic layer material as is CuAgAu.

Currently used GMR spin valve structures in which the current follows the plane of the layers, or CIP structures, typically have a sheet resistance, Rs, of 10 Ohm/Square resulting from a commonly used layer stack of NiFeCo/CoFe/Cu/CoFe/NiFeCo/IrMn formed on a substrate. Magnetic CoFe and NiFeCo materials have resistivities of about 12 to 20 $\mu\Omega$-cm in bulk, and Cu has a resistivity of 2 $\mu\Omega$-cm. CoFe—HfO, on the other hand, can easily be made with a resistivity greater than 1000 $\mu\Omega$-cm which is much higher than the values given above for either CoFe and NiFeCo. Therefore, the sheet resistance of a spin valve layer stack substituting CoFe—HfO for the magnetic layers material will be higher than that of a stack with magnetic layers formed with CoFe and NiFeCo. However, the dominant conduction paths are due to the nonmagnetic layers of Cu interleaved with the magnetic layers which have a much lower resistivity than the magnetic layers. These nonmagnetic Cu layers provide alternative current conduction paths to those provided by the magnetic layers of a higher conductivity to thereby shunt current through them from the magnetic layers leading to the so-called shunting effect. If, however, Cu in the nonmagnetic layers is replaced by either CuAu or CuAgAu, which have a resistivity of 8 to 10 $\mu\Omega$-cm, a spin valve structure of FeHfO/CuAgAu/CoFe—HfO/CrPtMn (and other variations) will have a much higher sheet resistance, possibly quadruple that of the typical currently used spin valve stack described above. Having a higher sheet resistance leads to a higher total resistance for the same number of squares (i.e. same device area) thereby resulting in either lower power consumption or fewer squares or device material (i.e. smaller device area) for the same device resistance resulting in a lower cost.

An SDT device has to be optimized as a whole to achieve high operating rates. There are basically four considerations. They are magnetics, tunnel junction transport, electrical circuits, and electronics, all of which must be fast and compatible with each other. The overall speed of a device is limited by the slowest aspect. First, the magnetic material itself must be capable of fast switching. The limiting factors are, as given above, the ferromagnetic resonance frequency (FMR), the mode of magnetization reversal, and eddy current. A similar structure can also be used in magnetic field sensor devices though the thickness ratio of the two magnetic layers and the lateral dimensions of the devices may be different. There is a substantial need for a high resistivity VGMR multilayer stack because of the large area under the upper interconnection contact to that stack and short path followed by current conducted through that stack. Because of this vertical conduction nature in VGMR structures, there is no shunting by highly conductive nonmagnetic material layers positioned between the magnetic layers since the current path is across these layers rather than parallel to them. For this reason, Cu is suitable as a nonmagnetic layer material as is CuAgAu.

Currently used GMR spin valve structures in which the current follows the plane of the layers, or CIP structures, typically have a sheet resistance, Rs, of 10 Ohm/Square resulting from a commonly used layer stack of NiFeCo/CoFe/Cu/CoFe/NiFeCo/IrMn formed on a substrate. Magnetic CoFe and NiFeCo materials have resistivities of about 12 to 20 $\mu\Omega$-cm in bulk, and Cu has a resistivity of 2 $\mu\Omega$-cm. CoFe—HfO, on the other hand, can easily be made with a resistivity greater than 1000 $\mu\Omega$-cm which is much higher than the values given above for either CoFe and NiFeCo. Therefore, the sheet resistance of a spin valve layer stack substituting CoFe—HfO for the magnetic layers material will be higher than that of a stack with magnetic layers formed with CoFe and NiFeCo. However, the dominant conduction paths are due to the nonmagnetic layers of Cu interleaved with the magnetic layers which have a much lower resistivity than the magnetic layers. These nonmagnetic Cu layers provide alternative current conduction paths to those provided by the magnetic layers of a higher conductivity to thereby shunt current through them from the magnetic layers leading to the so-called shunting effect. If, however, Cu in the nonmagnetic layers is replaced by either CuAu or CuAgAu, which have a resistivity of 8 to 10 $\mu\Omega$-cm, a spin valve structure of FeHfO/CuAgAu/CoFe—HfO/CrPtMn (and other variations) will have a much higher sheet resistance, possibly quadruple that of the typical currently used spin valve stack described above. Having a higher sheet resistance leads to a higher total resistance for the same number of squares (i.e. same device area) thereby resulting in either lower power consumption or fewer squares or device material (i.e. smaller device area) for the same device resistance resulting in a lower cost.

An SDT device has to be optimized as a whole to achieve high operating rates. There are basically four considerations. They are magnetics, tunnel junction transport, electrical circuits, and electronics, all of which must be fast and compatible with each other. The overall speed of a device is limited by the slowest aspect. First, the magnetic material itself must be capable of fast switching. The limiting factors are, as given above, the ferromagnetic resonance frequency (FMR), the mode of magnetization reversal, and eddy current screening. Dimensional resonance is not expected to be a problem at the operating rates of interest. All of these requirements can be accommodated by using CoFe—HfO films in a precessional switching mode. In order to do this, the easy axis (rest state) of the films must be perpendicular to a precession-inducing impulse field, as described in the background. This is not the way the majority of present-day devices work, though quasi-static switching where the easy axis is parallel to the applied field. The second consideration is the intrinsic RC time constant for a SDT junction. Because of the very rapid change of junction resistance with barrier thickness, the RC constant for a junction is basically proportional to the junction's RAP. The lower the RAP is, the smaller the RC constant is, with a RAP value of 13 k$\Omega$-$\mu$m$^2$ corresponding to a RC value of 1 nanosecond. Therefore, a RAP value of several k$\Omega$-$\mu$m$^2$ will be adequate for nanosecond device operation. The third consideration is essentially the RC and LC constants of the whole circuit device, with R being the device resistance and C and L the device parasitic capacitance and inductance. Design optimization is needed to limit the R, C, and L levels. The fourth consideration is the speed of the conditioning electronics. As a rule of thumb, the product of the gain and bandwidth is constant for a given amplifier. Therefore, the lower the gain, the faster the speed. The high signal level of a SDT device makes it possible for the voltage gain to be as low as 1. For example, with just 1-volt supply to a SDT bridge with a 30% magnetoresistance ratio for individual SDT resistors, the bridge output swing will be 300 mV for an isolator device with four active resistors, and 150 mV for a digital field sensor with two active resistors. This high signal level can be fed directly into a logic device without any amplification. Other techniques such as low voltage differential signaling (LVDS) and submicron BiCMOS fabrication process typically based on a silicon substrate also need to be used to achieve high rate of operation electronics.

In addition to the magnetoresistive galvanic signal isolators, magnetic field sensors and memory cell described above, there are many other magnetic based circuit devices that can benefit from substituting CoFe—HfO for the magnetic materials currently being used therein, such as fast re-programmable logic devices, other MRAM memory devices, read heads for magnetic recording disk drives, and derivative devices. Some of these devices will require operation in a "linear" mode as opposed to the two state "digital" mode described above. Such a linear mode also takes advantage of the excellent high rate of operation properties of CoFe—HfO ferromagnetic nanocomposite then films.

Although the present invention has been described with reference to preferred embodiments, workers skilled in the art will recognize that changes may be made in form and detail without departing from the spirit and scope of the invention.

What is claimed is:

1. A ferromagnetic thin-film based magnetoresistive device, said device comprising:
   a nonmagnetic intermediate layer, said intermediate layer having two major surfaces on opposite sides thereof;
   a first ferromagnetic material based film on one of said intermediate layer major surfaces having electrically conductive, ferromagnetic material nanogranules embedded in an intergranular material of a smaller electrical conductivity; and
   a second film on that remaining one of said intermediate layer major surfaces of a substantially ferromagnetic material.

2. The device of claim 1 wherein said material of said nanogranules is one of Fe, Co, Cr or alloys thereof.

3. The device of claim 1 wherein said ferromagnetic material of said second film is one of Fe, Co, Ni or alloys thereof.

4. The device of claim 1 wherein said intergranular material is one of HfO, TaN, HfCN, HfN, HfTa or CrO.

5. The device of claim 1 wherein said intermediate layer is formed of a nonmagnetic electrical conductor.

6. The device of claim 1 wherein said intermediate layer is formed of a nonmagnetic electrical insulator.

7. The device of claim 1 wherein said first ferromagnetic material based film is less than 1.0 $\mu$m in thickness.

8. A ferromagnetic thin-film based magnetoresistive device, said device comprising:
   a nonmagnetic intermediate layer, said intermediate layer having two major surfaces on opposite sides thereof;
   a first ferromagnetic material based film supported on one of said intermediate layer major surfaces having electrically conductive, ferromagnetic material nanogranules embedded in an intergranular material of a smaller electrical conductivity and having a coercivity; and
   a second film on that remaining one of said intermediate layer surfaces of a substantially ferromagnetic material, said second film having a coercivity greater than that of said first ferromagnetic material based film.

9. The device of claim 8 wherein said material of said nanogranules is one of Fe, Co, Cr or alloys thereof.

10. The device of claim 8 wherein said intergranular material is one of HfO, TaN, HfCN, HfN, HfTa or CrO.

11. The device of claim 8 wherein a nonmagnetic electrical conductor layer is formed as said intermediate layer.

12. The device of claim 8 wherein a nonmagnetic electrical insulator layer is formed as said intermediate layer.

13. The device of claim 1 further comprising an antiferromagnetic material film provided against said second film.

14. The device of claim 1 wherein said first ferromagnetic material based film has a permeability greater than 35.

15. The device of claim 1 wherein said first ferromagnetic material based film has a coercivity less than 300.

16. The device of claim 1 further comprising a substrate on which are supported said first ferromagnetic material based film, said intermediate layer and said second film.

17. The device of claim 1 further comprising an electrical conductor positioned across an electrical insulating layer from said first ferromagnetic material based film, said intermediate layer and said second film.

18. The device of claim 5 further comprising an antiferromagnetic material film provided against said second film.

19. The device of claim 6 further comprising an antiferromagnetic material film provided against said second film.

20. The device of claim 8 further comprising a substrate on which are supported said first ferromagnetic material based film, said intermediate layer and said second film.

21. The device of claim 8 further comprising an electrical conductor positioned across an electrical insulating layer from said first ferromagnetic material based film, said intermediate layer and said second film.

22. The device of claim 16 wherein said substrate comprises a monolithic integrated circuit.

23. A ferromagnetic thin-film based magnetoresistive device, said device comprising:
   a substrate having a major surface; and
   a first ferromagnetic material based film of a thickness less than 1.0 $\mu$m supported on said substrate major surface having electrically conductive, ferromagnetic material nanogranules embedded in an intergranular material of a smaller electrical conductivity so as to have a permeability greater than 35.

24. The device of claim 23 wherein said material of said nanogranules is one of Fe, Co, or Cr or alloys thereof.

25. The device of claim 23 wherein said intergranular material is one of HfO, TaN, HfCN, HfN, HfTa or CrO.

26. The device of claim 23 wherein a nonmagnetic electrical conductor layer is formed adjacent a side of said first ferromagnetic material based film.

27. The device of claim 23 wherein a nonmagnetic electrical insulator layer is formed adjacent a side of said first ferromagnetic material based film.

28. The device of claim 23 wherein said substrate comprises a monolithic integrated circuit.

29. The device of claim 23 further comprising an electrical conductor positioned across an electrical insulating layer from said first ferromagnetic material based film, said intermediate layer and said second film.

30. A ferromagnetic thin-film based magnetoresistive device, said device comprising:
   a substrate having a major surface; and
   a first ferromagnetic material based film of a thickness less than 1.0 $\mu$m supported on said substrate major surface having electrically conductive, ferromagnetic material nanogranules embedded in an intergranular material of a small electrical conductivity having a coercivity less than 300.

31. The device of claim 30 wherein said material of said nanogranules is one of Fe, Co, Cr or alloys thereof.

32. The device of claim 30 wherein said intergranular material is one of HfO, TaN, HfCN, HfN, HfTa or CrO.

33. The device of claim 30 wherein a nonmagnetic electrical conductor layer is formed adjacent a side of said first ferromagnetic material based film.

34. The device of claim 30 wherein a nonmagnetic electrical insulator layer is formed adjacent a side of said first ferromagnetic material based film.

35. The device of claim 30 wherein said substrate comprises a monolithic integrated circuit.

36. The device of claim 30 further comprising an electrical conductor positioned across an electrical insulating layer said first ferromagnetic based film, said intermediate layer and said second film.

37. The device of claim 8 wherein said first ferromagnetic material based film is less than 1.0 $\mu$m in thickness.

38. The device of claim 8 wherein said ferromagnetic material of said second film is one of Fe, Co, Ni or alloys thereof.

39. The device of claim 8 further comprising an antiferromagnetic material film provided against said second film.

40. The device of claim 8 wherein said first ferromagnetic material based film has a permeability greater than 35.

41. The device of claim 8 wherein said first ferromagnetic material based film has a coercivity less than 300.

42. The device of claim 20 wherein said substrate comprises a monolithic integrated circuit.

43. The device of claim 11 further comprising an antiferromagnetic material film provided against said second film.

44. The device of claim 12 further comprising an antiferromagnetic material film provided against said second film.

45. The device of claim 1 further comprising a third film of a substantially ferromagnetic material positioned between said first ferromagnetic material based film and said nonmagnetic intermediate layer.

46. The device of claim 8 further comprising a third film of a substantially ferromagnetic material positioned between said first ferromagnetic material based film and said nonmagnetic intermediate layer.

47. The device of claim 1 wherein said first ferromagnetic material based film is positioned between said intermediate layer and a second ferromagnetic material based film having electrically conductive, ferromagnetic material nanogranules embedded in an intergranular material of a small electrical conductivity.

48. The device of claim 8 wherein said first ferromagnetic material based film is positioned between said intermediate layer and a second ferromagnetic material based film having electrically conductive, ferromagnetic material nanogranules embedded in an intergranular material of a small electrical conductivity.

49. The device of claim 1 connected between a pair of electrodes such that any current established between said electrodes primarily flows perpendicular to said first ferromagnetic material based film, said first nonmagnetic intermediate layer and said second film.

50. The device of claim 8 connected between a pair of electrodes such that any current established between said electrodes primarily flows perpendicular to said first ferromagnetic material based film, said first nonmagnetic intermediate layer and said second film.

51. The device of claim 1 connected between a pair of electrodes such that current between said electrodes primarily flows parallel to said first ferromagnetic material based film, said first nonmagnetic intermediate layer and said second film.

52. The device of claim 8 connected between a pair of electrodes such that current between said electrodes primarily flows parallel to said first ferromagnetic material based film, said first nonmagnetic intermediate layer and said second film.

* * * * *